US006791898B1

(12) United States Patent
Manapat et al.

(10) Patent No.: US 6,791,898 B1
(45) Date of Patent: Sep. 14, 2004

(54) MEMORY DEVICE PROVIDING ASYNCHRONOUS AND SYNCHRONOUS DATA TRANSFER

(75) Inventors: Rajesh Manapat, San Jose, CA (US); Manoj Roge, San Jose, CA (US); Kannan Srinivasagam, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 29 days.

(21) Appl. No.: 10/269,391

(22) Filed: Oct. 11, 2002

(51) Int. Cl.$^7$ ................................................. G11C 8/00
(52) U.S. Cl. ................. 365/233; 365/233.5; 365/230.01
(58) Field of Search ............................. 365/233, 233.5, 365/230.01, 240, 185.11; 327/192; 711/1

(56) References Cited

U.S. PATENT DOCUMENTS 5,548,560 A * 8/1996 Stephens, Jr. et al. ... 365/233.5
6,172,936 B1 * 1/2001 Kitazaki ..................... 365/233

* cited by examiner

*Primary Examiner*—Van Thu Nguyen
*Assistant Examiner*—N. Nguyen
(74) *Attorney, Agent, or Firm*—Wagner, Murabito & Hao LLP

(57) ABSTRACT

Embodiments of the present invention provide a memory device having multiple modes of data transfer. In one embodiment, async/sync logic and a configuration register provide for asynchronous and synchronous data transfer. The async/sync logic utilizes the configuration register and various control signals to determine whether a data transfer operation should be asynchronous or synchronous. The async/sync logic also utilizes the configuration register and various control signals to determine other functionalities of the particular data transfer mode. Functionalities may include normal and page mode, page length, bust read, linear or interleaved burst, burst wrap, burst suspend, data hold length, first access latency, transition between synchronous and asynchronous mode, and the like.

18 Claims, 27 Drawing Sheets

| RESERVED | READ MODE | RES'D | FIRST ACCESS LATENCY | | RES'D | DATA HOLD | RES'D | BURST SEQ. | RESERVED | | | BURST WRAP | SYNC. BURST LENGTH | |
|---|---|---|---|---|---|---|---|---|---|---|---|---|---|---|
| A21-16 | A15 | A14 | A13 | A12 | A11 | A10 | A9 | A8 | A7 | A6 | A5 | A4 | A3 | A2 | A1 | A0 |

FIGURE 6

| BIT(S) | NAME | DESCRIPTION |
|---|---|---|
| 21-16 | RESERVED | RESERVED |
| 15 | ASYNC/SYNC SELECTION | 0 - ASYNCHRONOUS MODE (DEFAULT)<br>1 - SYNCHRONOUS READ - ASYNCHRONOUS WRITE MODE |
| 14 | RESERVED | RESERVED |
| 13-11 | FIRST ACCESS LATENCY COUNT | 011 - 3 CLOCK LATENCY (DEFAULT)<br>100 - 4 CLOCK LATENCY<br>101 - 5 CLOCK LATENCY<br>ALL OTHERS - RESERVED |
| 10 | RESERVED | RESERVED |
| 9 | DATA HOLD COUNT | 0 - HOLD DATA FOR ONE CLOCK CYCLE (DEFAULT)<br>1 - HOLD DATA FOR TWO CLOCK CYCLES |
| 8 | RESERVED | RESERVED |
| 7 | BURST SEQUENCE | 0 - INTERLEAVED BURST ORDER<br>1 - LINEAR BURST ORDER (DEFAULT) |
| 6-4 | RESERVED | RESERVED |
| 3 | BURST WRAP | 0 - WRAP BURSTS WITHIN BURST LENGTH DEFINED BY M3CR[2:0]<br>1 - DON'T WRAP ACCESSES WITHIN BURST LENGTH (DEFAULT) |
| 2-0 | BURST LENGTH | 001 - 4 WORD BURST<br>010 - 8 WORD BURST<br>011 - 16 WORD BURST<br>111 - CONTINUOUS BURST (DEFAULT) |

FIGURE 7A

| BIT(S) | NAME | DESCRIPTION |
|---|---|---|
| 21-3 | RESERVED | RESERVED |
| 2 | ASYNCHRONOUS PAGE MODE LENGTH | 0 - 4 - WORD LENGTH (DEFAULT)<br>1 - 8 - WORD LENGTH |
| 1-0 | RESERVED | RESERVED |

FIGURE 7B

| | | | BURST ADDRESS SEQUENCE (DECIMAL) | | | | | |
|---|---|---|---|---|---|---|---|---|
| START ADDR. (DEC) | 4-WORD BURST M3CR[2:0]=001b | | 8-WORD BURST M3CR[2:0]=001b | | 16-WORD BURST M3CR[2:0]=001b | | 512-WORD BURST M3CR[2:0]=001b | |
| | LINEAR | INTER-LEAVED | LINEAR | INTERLEAVED | LINEAR | INTERLEAVED | LINEAR | |
| 0 | 0-1-2-3 | 0-1-2-3 | 0-1-2-3-4-5-6-7 | 0-1-2-3-4-5-6-7 | 0-1-2-3-4..14-15 | 0-1-2-3-4..14-15 | 0-1-2-3...510-511 | |
| 1 | 1-2-3-0 | 1-0-3-2 | 1-2-3-4-5-6-7-0 | 1-0-3-2-5-4-7-6 | 1-2-3-4..14-15-0 | 1-0-3-2-5..15-14 | 1-2-3...510-511-0 | |
| 2 | 2-3-0-1 | 2-3-0-1 | 2-3-4-5-6-7-0-1 | 2-3-0-1-6-7-4-5 | 2-3-4-5..15-0-1 | 2-3-0-1-6..12-13 | 2-3-4...511-0-1 | |
| 3 | 3-0-1-2 | 3-2-1-0 | 3-4-5-6-7-0-1-2 | 3-2-1-0-7-6-5-4 | 3-4-5..15-0-1-2 | 3-2-1-0-7..13-12 | 3-4-5...511-0-1-2 | |
| 4 | | | 4-5-6-7-0-1-2-3 | 4-5-6-7-0-1-2-3 | 4-5...15-0-1-2-3 | 4-5-6-7-0..10-11 | 4-5...511-0-1..3 | |
| 5 | | | 5-6-7-0-1-2-3-4 | 5-4-7-6-1-0-3-2 | 5-5-7..15-0-1..4 | 5-4-7-6-1..11-10 | 5-6-7...511-0-1..4 | |
| 6 | | | 6-7-0-1-2-3-4-5 | 6-7-4-5-2-3-0-1 | 6-7-8..15-0-1..5 | 6-7-4-5-2..8-9 | 6-7-8...511-0-1..5 | |
| 7 | | | 7-0-1-2-3-4-5-6 | 7-6-5-4-3-2-1-0 | 7-8-9..15-0-1..6 | 7-6-5-4-3..9-8 | 7-8-9...511-0-1..6 | |
| .. | .. | .. | | | | | | |
| 14 | | | | | 14-15-0-1-2..13 | 14-15-12-13..0-1 | 14..511-0-1..13 | |
| 15 | | | | | 15-0-1-2-3..14 | 15-14-13-12..1-0 | 15...511-0-1..14 | |
| WRAP (M3CR[3]=0) | | | | | | | | |

FIGURE 13B

| | BURST ADDRESS SEQUENCE (DECIMAL) | | | | | | |
|---|---|---|---|---|---|---|---|
| START ADDR. (DEC) | 4-WORD BURST M3CR[2:0]=001b | | 8-WORD BURST M3CR[2:0]=001b | | 16-WORD BURST M3CR[2:0]=001b | | 512-WORD BURST M3CR[2:0]=001b |
| | LINEAR | INTER-LEAVED | LINEAR | INTERLEAVED | LINEAR | INTERLEAVED | LINEAR |
| 0 | 0-1-2-3 | N/A | 0-1-2-3-4-5-6-7 | N/A | 0-1-2-3..14-15 | N/A | 0-1-2-3..510-511 |
| 1 | 1-2-3-4 | N/A | 1-2-3-4-5-6-7-8 | N/A | 1-2-3-4..15-16 | N/A | 1-2-3-4..511-512 |
| 2 | 2-3-4-5 | N/A | 2-3-4-5-6-7-8-9 | N/A | 2-3-4-5..16-17 | N/A | 2-3-4-5..512-513 |
| 3 | 3-4-5-6 | N/A | 3...10 | N/A | 3....18 | N/A | 3....514 |
| 4 | | | 4....11 | | 4....19 | | 4....515 |
| 5 | | | 5....12 | | 5....20 | | 5....516 |
| 6 | | | 6....13 | | 6....21 | | 6....517 |
| 7 | | | 7....14 | | 7....22 | | 7....518 |
| .. | .. | .. | | | | .. | .. |
| 14 | | | | | 14....29 | N/A | 14....525 |
| 15 | | | | | 15....30 | N/A | 15....526 |
| WRAP (M3CR[3]=1) | | | | | | | |

FIGURE 13B (CONT.)

MEMORY DEVICE PROVIDING ASYNCHRONOUS AND SYNCHRONOUS DATA TRANSFER

FIELD OF THE INVENTION

Embodiments of the present invention relate to memory devices, and more particularly to data transfer modes for memory devices.

BACKGROUND OF THE INVENTION

In the conventional art, memory devices either transfer data synchronously or asynchronously. In asynchronous transfer, one device may initiate the transfer and wait until the another device responds. In synchronous transfer, the transfer occurs according to a clock signal that can be shared between two devices.

Referring to FIG. 1, a block diagram of an asynchronous memory device 100 in accordance with the conventional art is shown. The memory device 100 is comprised of an array of memory cells 105, a row address decoder 110, a column address decoder 115, sense amplifier and data-in driver 120, data buffer 125, and control logic 130. The control logic 130 receives various control signals 135, such as chip enable, output enable, write enable, and the like. The control logic 130 controls the state of the row decoder 110, column decoder 115, sense amplifier and data-in driver 120, and data buffer 125 in accordance with such control signals 135.

Addresses are received from an address bus 140 by the row and column decoders 110, 115. Typically, the lower address bits are decoded by the column decoder 115, while the upper address bits are decoded by the row decoder 110, or multiplexed addressing can be used. The output of the decoders 110, 115 select the appropriate wordlines (row) and bitlines (column) of the memory cell array 105.

During a write operation, the data buffer 125 can receive data from a data bus 145 to be written to a plurality of memory cells. The control logic 130 and data-in driver 120 provide the correct wordline and bitline biasing to perform a write operation to the memory cell selected by the row and column decoders 110, 115 and based upon the data values buffered by the data buffer 125.

During a read operation, the control logic 130 provides the correct wordline and bitline biasing for performing a read operation of the memory cell selected by the row and column decoders 110, 115. The sense amplifier 120 can detect a signal on the selected bitline and output an amplified signal to the data buffer 125 indicative of the programmed state of the memory cell. The data buffer 125 then drives the data bus 145 in accordance with the output from the sense amplifier 120.

Referring now to FIG. 2, a block diagram of a synchronous memory device 200 in accordance with the conventional art is shown. The memory device 200 is comprised of an array of memory cells 205, an address register 210, a row address decoder 215 and a column address decoder 220, sense amplifier and data-in driver 225, data register 230, data buffer 235, and control logic 240. The control logic 240 receives various control signals 245 such as chip enable, output enable, write enable, clock, and the like. The control logic 240 controls the state of the address register 210, row decoder 215, column decoder 220, sense amplifier and data-in driver 225, data register 230 and data buffer 235 in accordance with such control signals 245.

Addresses are received on an address bus 250 and loaded into the address register 210 according to a clock signal. The latched addresses are then decoded by the row and column decoders 215, 220. Typically the lower address bits are decoded by the column decoder 220, while the upper address bits are decoded by the row decoder 215. The output of the decoders selects the appropriate wordlines (row) and bitlines (column) of the memory cell array 205.

During a write operation, the data buffer 235 receive data to be written to a plurality of memory cells, which is latched by the data register 230 in accordance with a clock signal. The control logic 240 and data-in driver 225 provide the correct wordline and bitline biasing to perform a write operation to the memory cell selected by the row and column decoders 215, 200 and based upon the latched data values.

During a read operation, the control logic 225 provides the correct wordline and bitline biasing for performing a read operation of the memory cell selected by the row and column decoders 215, 220. The sense amplifier 225 detects a signal on the selected bitline and outputs a signal to the data register 230 indicative of the programmed state of the memory cell. The data register 230 latches the signal from the sense amplifier 225 and then provides the data to the data buffer 235 in accordance with a clock signal. The data buffer 235 then drives a data bus 255 based upon such data values.

Accordingly, memory devices according to the conventional art are disadvantageous in that they typically only provide a single mode of data transfer. That is, memory devices according to the conventional art typically either provide for only asynchronous data transfer or only synchronous data transfer.

SUMMARY OF THE INVENTION

Embodiments of the present invention provide a memory device having multiple modes of data transfer. Embodiments of the present invention provide for asynchronous data transfer. Embodiments of the present invention provide for synchronous data transfer.

Embodiments of the present invention provide multiple modes of data transfer utilizing async/sync logic and a configuration register. The async/sync logic utilizes the configuration register and various control signals to determine whether a data transfer operation should be asynchronous or synchronous. The async/sync logic also utilizes the configuration register and various control signals to determiner other functionalities of the particular data transfer mode. Functionalities of a data transfer mode may include normal and page mode, page length, burst read, linear or interleaved burst, burst wrap, burst suspend, data hold length, first access latency, transition between synchronous and asynchronous mode, and the like.

Accordingly, the multiple modes of data transfer provided by embodiments of the present invention advantageously allow for replacing NOR-flash memory devices with NAND-flash memory devices. Embodiments of the present invention are also advantageous in that the memory device may be operated as a read through device.

BRIEF DESCRIPTION OF THE DRAWINGS

The present invention is illustrated by way of example and this should not be construed as limiting, in the figures of the accompanying drawings and in which like reference numerals refer to similar elements and in which:

FIG. 6 shows a mapping of the address bits to various functionality provided by the configuration register, in accordance with one possible implementation of the present invention.

FIG. 7A shows a designation of bits of a first configuration register and their corresponding functionality, in accordance with one possible implementation of the present invention.

FIG. 7B shows a designation of bits of a second configuration register and their corresponding functionality, in accordance with one possible implementation of the present invention.

FIG. 13B shows exemplary burst address sequences, in accordance with one possible implementation of the present invention.

DETAILED DESCRIPTION OF THE EMBODIMENTS

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
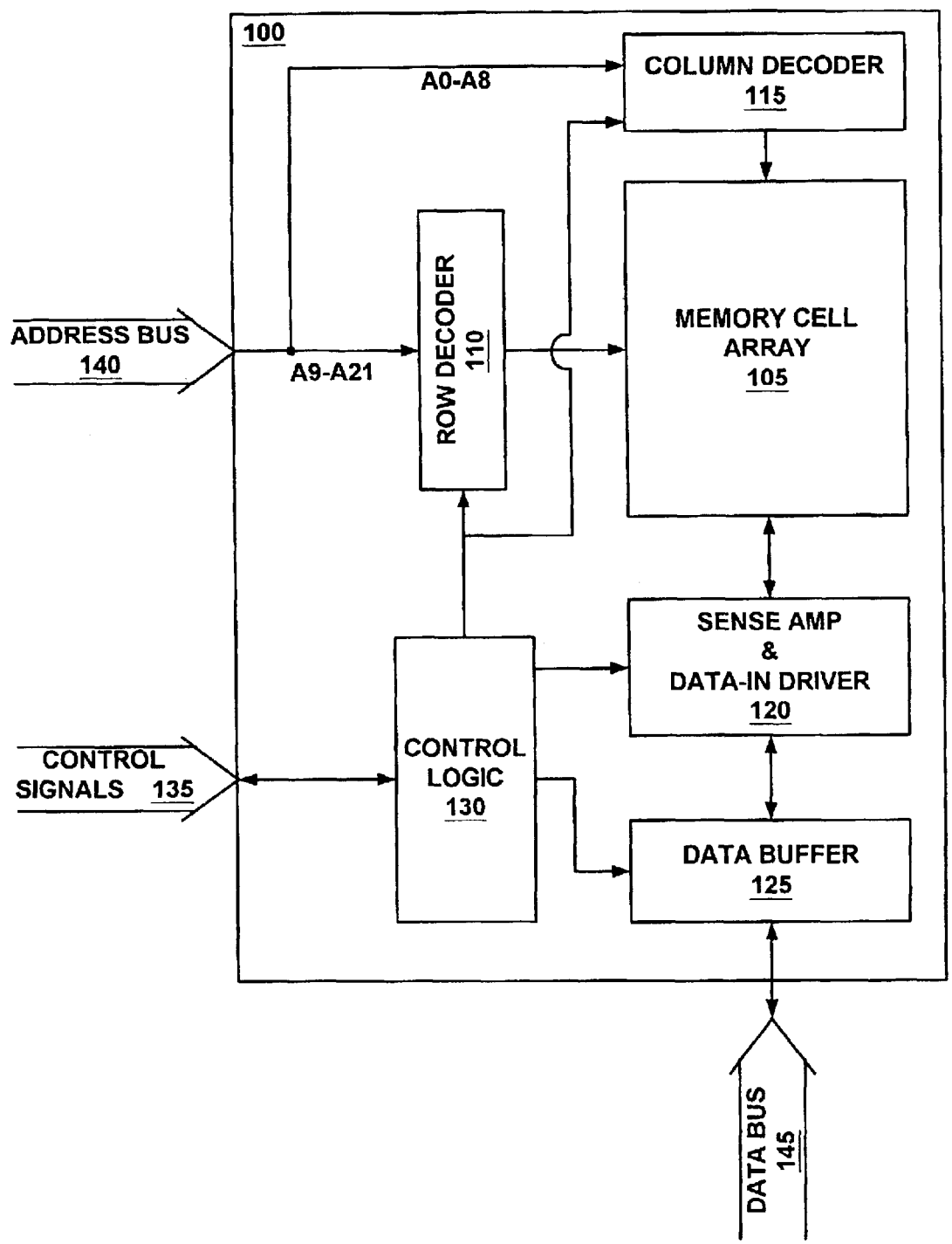
FIG. 1 shows a block diagram of an asynchronous memory device, in accordance with the conventional art.
Figure 2:
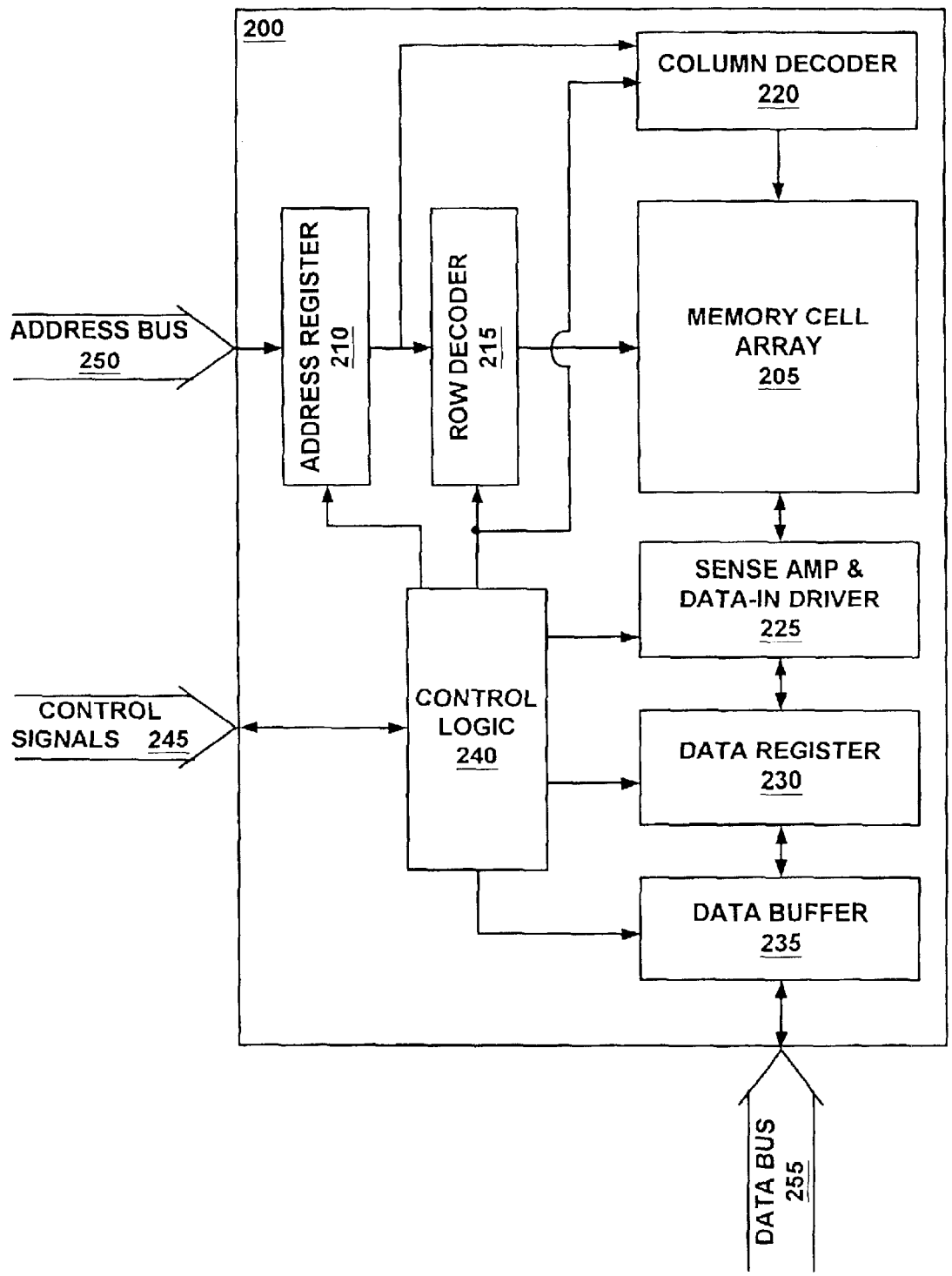
FIG. 2 shows a block diagram of a synchronous memory device, in accordance with the conventional art.
Figure 3:
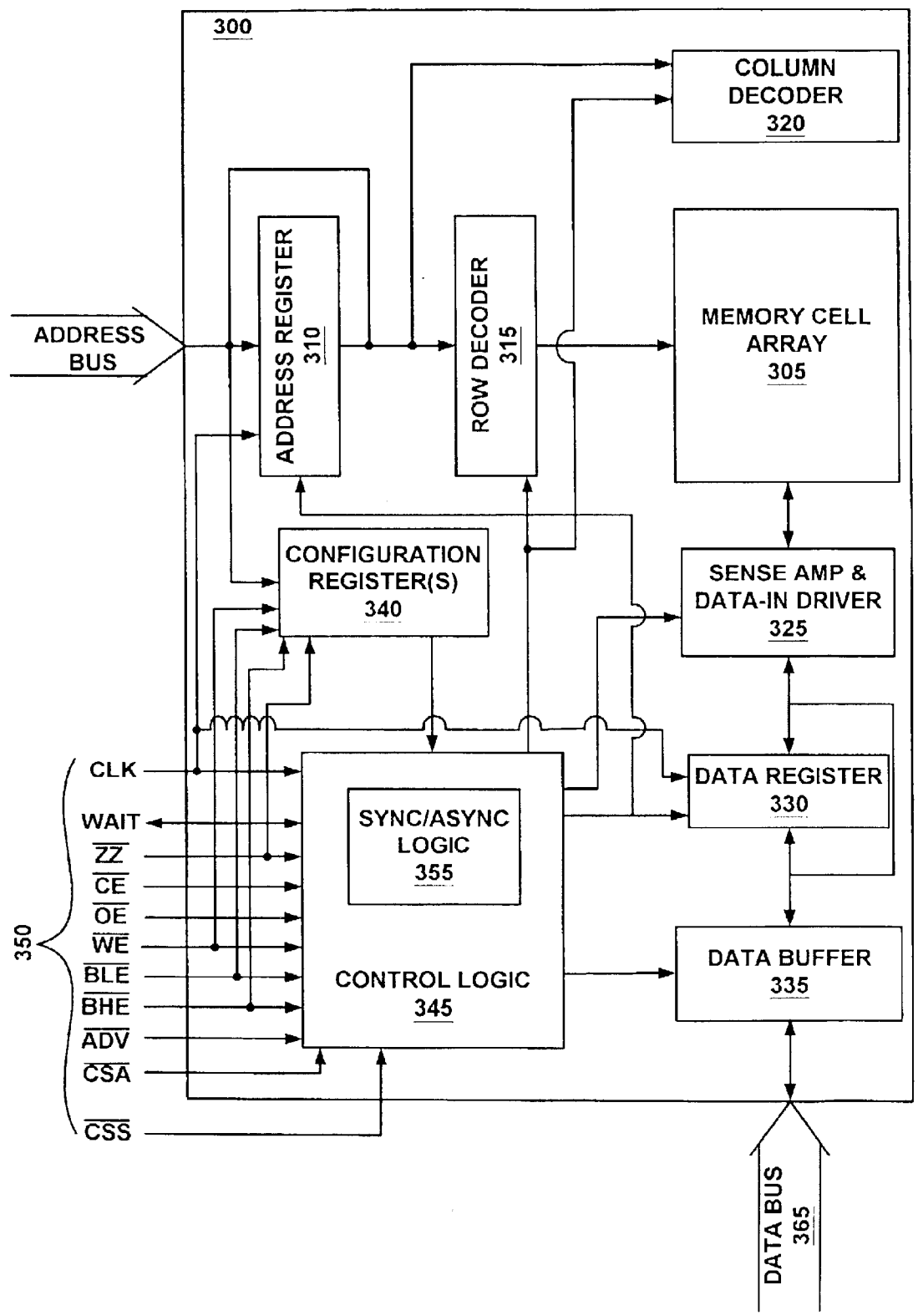
FIG. 3 shows a block diagram of a memory device, in accordance with one embodiment of the present invention.

Referring now to FIG. 3, a block diagram of a memory device 300 in accordance with one embodiment of the present invention is shown. The memory device 300 is comprised of an array of memory cells 305, address register 310, a row address decoder 315, a column address decoder 320, sense amplifier and data-in driver 325, data register 330, data buffer 335, configuration register 340 and control logic 345 The control logic 345 receives various control signals 350, such as chip enable (/CE), output enable (/OE), write enable (/WE), clock (CLK), and the like. The control logic 345 also includes asynchronous/synchronous (async/sync) logic 355. The control logic 345 controls the state of the address register 310, row decoder 315, column decoder 320, sense amplifier and data-in driver 325, data register 330 and data buffer 335 in accordance with the received control signals 350.

The async/sync logic 355 provides for multiple modes of data transfer by the memory device 300. The memory device 300 in asynchronous mode provides for asynchronous read and write transfers. The memory device 300 in synchronous mode provides for synchronous read and asynchronous write transfers.

In one implementation, the async/sync logic 355 portion of the control logic 345 controls operation in asynchronous and synchronous modes, based upon the state of various control signals 350. Operation may either be asynchronous read, asynchronous write, or synchronous read.

In another implementation, the memory device 300 has a chip select asynchronous (/CSA) pin, a chip select synchronous (/CSS) pin, and a write enable (/WE) pin for receiving corresponding control signals. When the chip select asynchronous pin is asserted low, control logic contained in the memory device 300 performs asynchronous read operations. When the chip select synchronous pin is asserted low, the control logic 345 performs synchronous read operations. When the output enable pin is asserted low, the control logic 345 performs asynchronous write operations.

In another implementation, the memory device 300 has an advance (/ADV) pin, a chip enable (/CE) pin, a write enable (/WE) pin, and an output enable (/OE) pin. When the chip enable (/CE) pin and the advance (/ADV) pin are asserted low, a synchronous read is performed. The output enable (/OE) is asserted low when valid data is present on the data bus. When the write enable (/WE) and advance (/ADV) are asserted low an asynchronous write is performed.

In another implementation, the async/sync logic 355 portion of the control logic 345 controls operation in asynchronous and synchronous modes based upon the contents of a plurality of configuration registers 340. The configuration register 340 may be a single register or may comprise a plurality of registers. The memory device 300 will operate as either an asynchronous or synchronous device, based upon the contents of the configuration registers 340. Additionally, configuration registers 340 can also configure options such as burst sequence, first access latency length, and the like.

In one implementation, a series of reads and/or writes to a specified address can be utilized to write to the configuration register 340. In another implementation, a particular combination of control bits 350 and/or address bits 360 can be utilized to write to the configuration registers 340.

In asynchronous mode, the input/output (I/O) pins connected to the data bus 365 are placed in a high impedance state when the device is deselected (/CE high), output are disabled (/OE high), the byte enables are disabled (/BLE and /BHE high), or during a write operation (/CE low and /WE low).

During an asynchronous write operation, the data buffer 335 receives data to be written to a plurality of memory cells. The row and column decoders 315, 320 receive and decode the address of the desired memory cell to which the data is to written. The control logic 345 and data-in driver 325 provide the correct wordline and bitline biasing to perform a write operation to the memory cell selected by the row and column decoder 315, 320 and based upon the data value buffered by the data buffer 335.

During an asynchronous or synchronous read operation, the control logic 345 provides the correct wordline and bitline biasing for performing a read operation of the memory cell selected by the row and column decoder 315, 320, based upon an address on the address bus 360. The sense amplifier 325 detects a signal on the selected bitline and outputs an amplified version of the signal to the data buffer 335 to indicate the programmed state of the memory cell. The data buffer 335 then drives a data bus 365 in accordance with the output from the sense amplifier 325.

In synchronous mode, the input/output (I/O) pins connected to the data bus 365 are placed in a high impedance state when the device is deselected (/CE high), outputs are disabled (/OE high), the byte enables are disabled (/BLE and /BHE high), or during a write operation (/CE low and /WE low).

In one implementation, the async/sync logic 355 also provides for page mode asynchronous read and write. In an exemplary configuration, the configuration register 340 provides for selection of page length of four or eight words. In another implementation, the async/sync logic 355 also provides for random page read and write.

In another implementation, the async/sync logic 355 also provides for synchronous burst read access. The configuration register 340 provides for selection of the number of multiple reads that can be performed. In one exemplary configuration, burst lengths of four, eight, sixteen, or five hundred twelve words can be selected. In yet another implementation, the async/sync logic 355 also provides for linear or interleaved burst read access sequences.

Figure 4A:
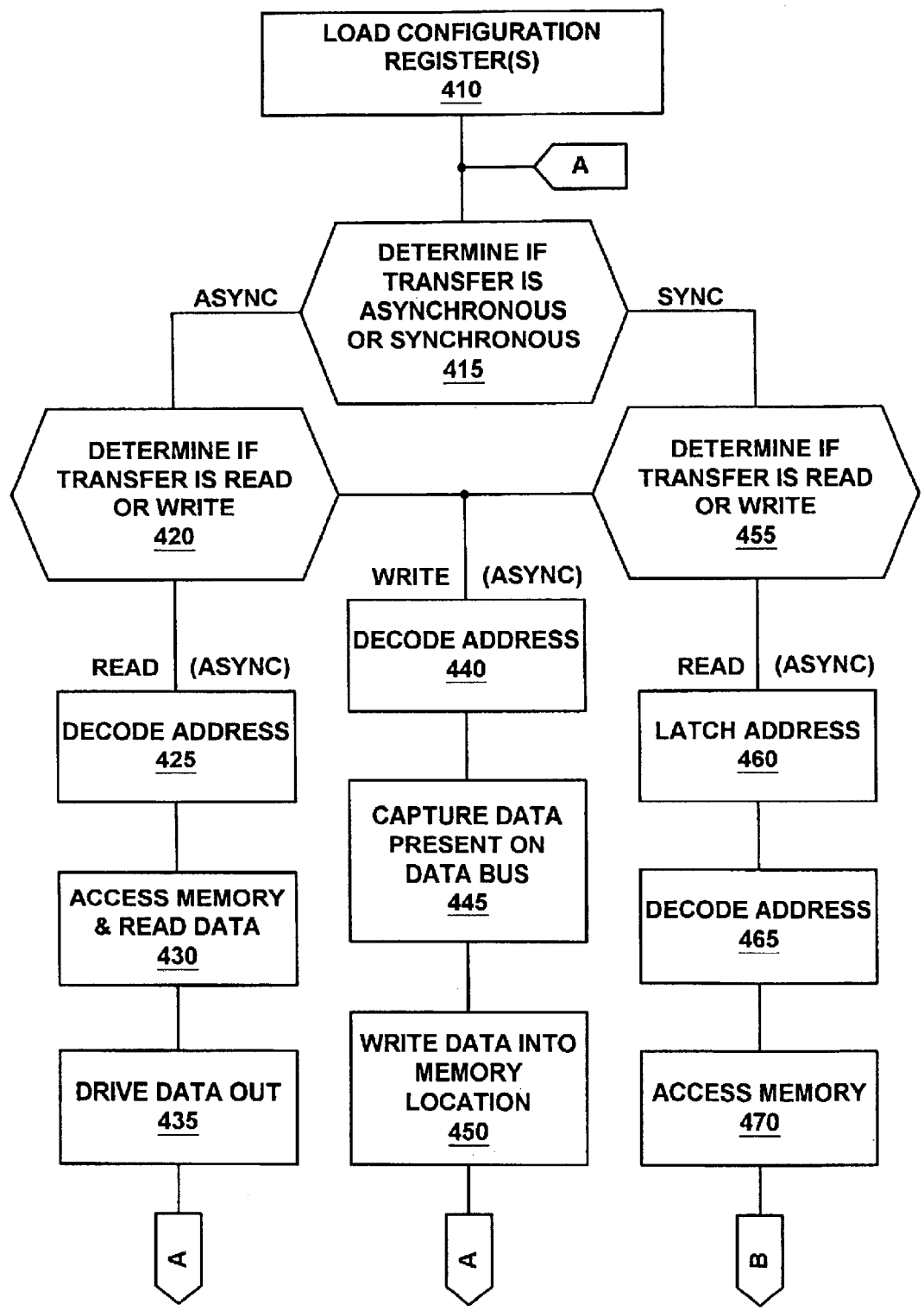
FIGS. 4A–4B show a flow diagram of a data transfer method utilized in a memory system, in accordance with one embodiment of the present invention.
Figure 4B:
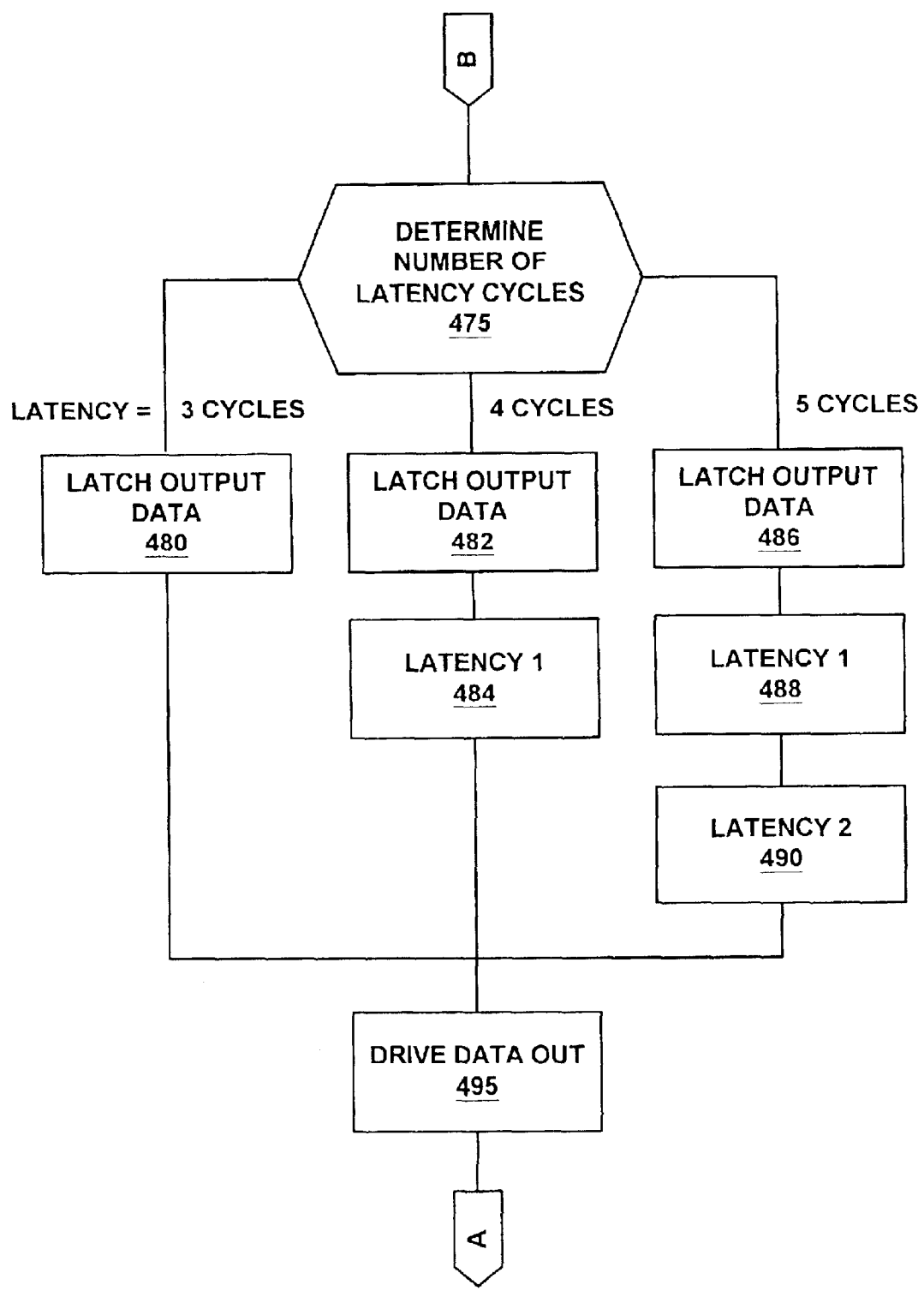

Referring now to FIGS. 4A–4B, a flow diagram of a data transfer method utilized in a memory system in accordance with one embodiment of the present invention is shown. At step 410, the memory system loads configuration information into one or more configuration registers. In one implementation, the state of an address bus is loaded into the configuration register when a specified sequence of control signals occur. In another implementation, the state of a data bus is loaded into the configuration register using a series of reads from and/or writes to a specified address.

At step 415, an async/sync logic portion of a control logic accesses the configuration register to determine whether asynchronous or synchronous transfer is chosen, in one implementation. In another implementation, a pair of chip selects are provided, chip select asynchronous (/CSA) and chip select synchronous (/CSS). The state of the chip selects determines whether asynchronous or synchronous transfer is performed.

If the transfer is asynchronous, then the system determines whether it is a read or a write operation, at step 420. In one implementation, the write enable (/WE) is checked to determine if the desired operation is a read transfer.

If the transfer is an asynchronous read transfer, the system decodes an address present on the address bus, at step 425. At step 430, the system then accesses a memory location to read data therefrom. At step 435, the system then drives the data out on a data bus.

If the transfer is an asynchronous write transfer, the system decodes an address present on the address bus, at step 440. At step 445, the system also buffers the data to be written. At step 450, the system then accesses the memory location and writes the data.

If the transfer is synchronous, the system determines whether it is a read or write operation, at step 455. If the transfer is a write transfer, the system decodes the address present on the address bus, at step 440. At step 445, the system also buffers the data to be written. At step 450, the system then accesses the memory location and writes the data.

If the transfer is a synchronous read transfer, then the address present on the address bus is latched at step 460. At step 465, the system decodes the address. At step 470, the system then accesses the memory location from which to read data. In so doing, a sense amplifier outputs a signal indicative of the state of the memory cell at the specified address location. The system then determines the appropriate cycles of latency, at step 475.

If latency is set to 3 clock cycles, then at step 480, the system latches the data from the sense amplifier. At step 495, the system then drives the data out. If latency is set to 4 clock cycles, the system latches the data from the sense amplifier, at step 482. At steps 484 a first latency is executed. The system then drives the data out at step 495. If the latency is set to 5 clock cycles, the system latches data from the sense amplifier, at step 486. At steps 488 and 490 a first latency and a second latency are executed. The system then drives the data out at step 495. In one implementation, latency may comprise a cascade of latches.

In an optional feature, the synchronous read method provides for burst transfer of data. In one implementation, after step 470, the configuration register is accessed to determine the length of the burst transfer. If a burst transfer is specified, a counter is initialized. The burst counter is compared against the specified burst length. If the burst count is less then the specified burst length, the burst counter is incremented for the next cycle. The burst count is then added to the address and steps 465 and 470 are repeated. For each accessed memory location, the applicable steps of 475–495 are also executed. Hence, the data value stared in the first memory location of a burst read operation has a desired latency. However, all other data values stored in the additional memory locations of a burst sequence are transferred without additional latency added between each output. When the burst count exceeds the specified burst length, no further memory locations are accessed via steps 465 and 470, for the particular synchronous read operation.

Figure 5:
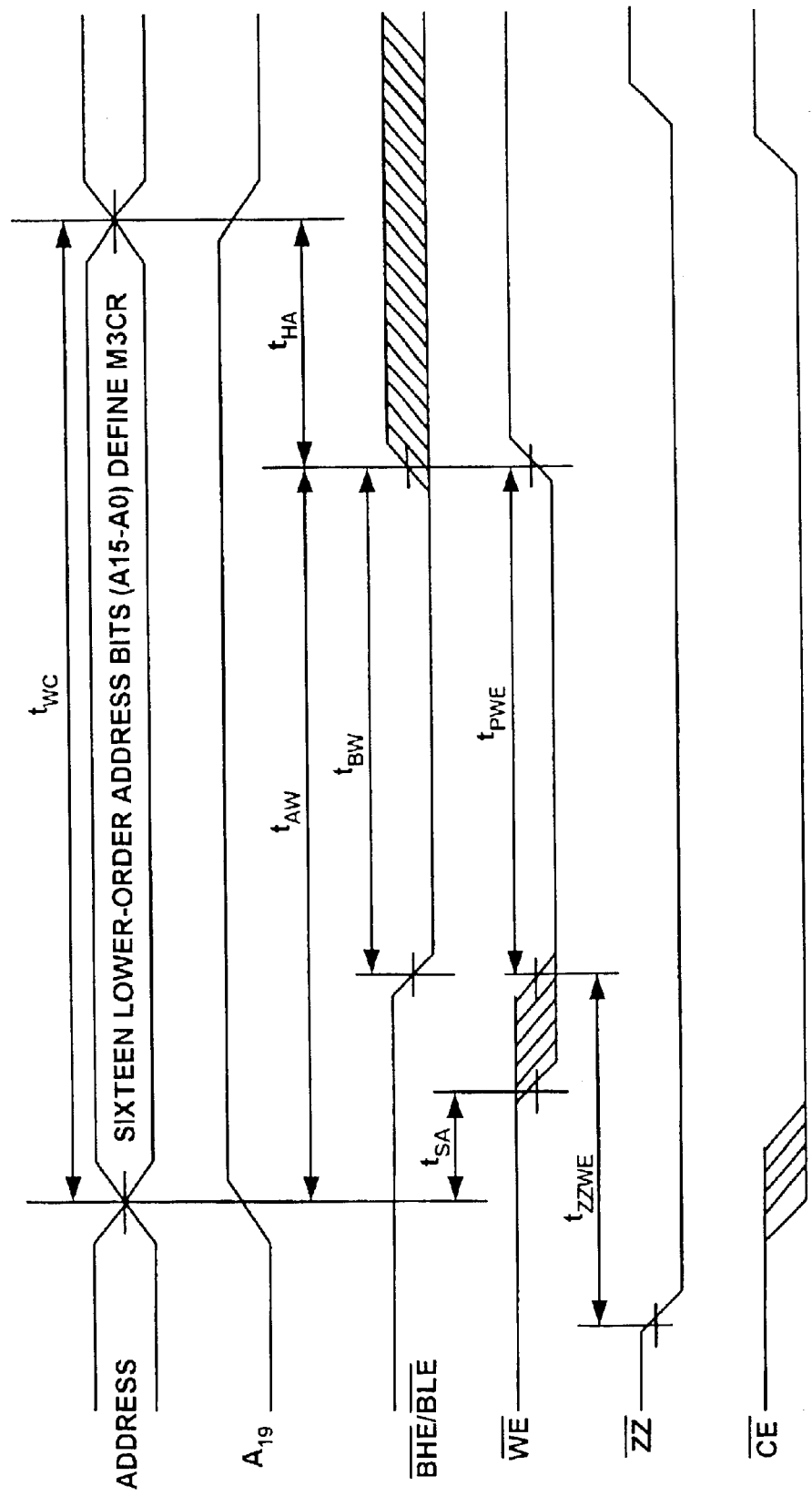
FIG. 5 shows a timing diagram for loading the contents of the configuration register, in accordance with one possible implementation of the present invention.

FIG. 5 shows a timing diagram for loading the contents of A configuration register in accordance with one embodiment of the present invention. The configuration register is set by first enabling the deep sleep (/ZZ) pin low. Once this is done, the chip enable (/CE) is enabled low, while the address bits are set according to the desired configuration register state, along with A19 set high. Finally, the write enable (/WE), byte low enable (/BLE), and byte high enable (/BHE) are all enabled low to write to the configuration register. The configuration register effectively latches the state of an address bus, representing control signals, for access by an async/sync logic.

FIG. 6 shows a mapping of address bits to various functionality provided by a configuration register, in accordance with one embodiment of the present invention. Address bit A0, A1 and A2, specify a synchronous burst length. Address bit A3 specifies whether to wrap a burst within a defined burst length. Address bit A7 specifies a linear or interleaved burst order. Address bit A9 specifies the number of clock cycles that data is held on a data bus. Address bits A11, A12 and A13 specifies the number of clock cycles for synchronous read access latency. Address bit A15 specifies whether the memory device operates in asynchronous or synchronous mode. Address bits A4, A5, A6, A8, A10, A14, and A16–A21 are not used in this particular implementation. However, they may be used to specify additional functionalities.

FIG. 7A shows a designation of bits of a first configuration register and their corresponding functionality, in accordance with one embodiment of the present invention. The most significant bit, A15, of the configuration register specifies whether the memory device operates in an asynchronous read/write mode or a synchronous read mode/asynchronous write mode. The other bits can be used to specify additional features. For example, bits A13, A12 and A11 specify the first access latency count. These three bits of the configuration register control the number of clock cycles that are placed between the command and the first piece of valid data during a synchronous read. Bit A9 specifies the data hold count. This bit determines if data remains valid for one or two cycles on the data bus after a read. This allows flexibility in system designs with processors that need longer setup time. Bit A7 specifies the burst sequence. The bit provides a choice of linear or interleaved bursts. Bit A3 specifies whether the burst operation wraps or not. If it is set 'ON', then the burst will wrap around to the beginning if a burst access is started in the middle address of the sequence. If it is 'OFF', the burst will continue linearly. While the least significant bits, A2, A1 and A0 specify the burst length, bits A4, A5, A6, A8, A10, A14 and A16–A21 are not used in this particular implementation. However, they may be used to specify additional functionalities.

FIG. 7B shows a designation of bits of a second configuration register and their corresponding functionality, in accordance with one embodiment of the present invention. Bit A2 specifies the page read length. When the memory device is being operated in the asynchronous mode, an embodiment allows a page read of four or eight words. Bits A0, A1 and A3–21 are not used in this particular implementation. However, they may be used to specify additional functionalities.

Figure 8A:
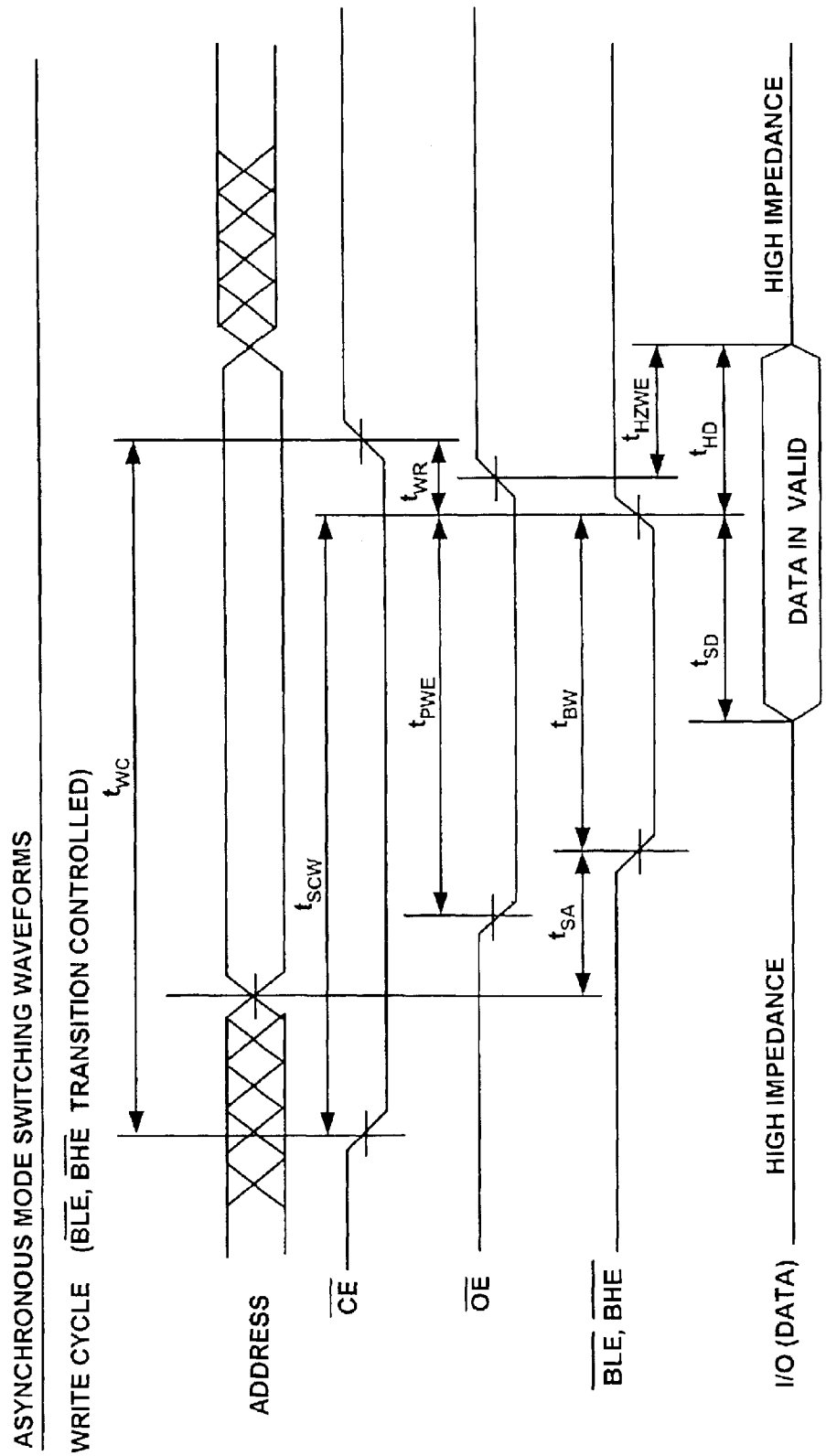
FIGS. 8A, 8B, 8C, and 8D show timing diagrams of asynchronous write operations, in accordance with various possible implementations of the present invention.
Figure 8B:
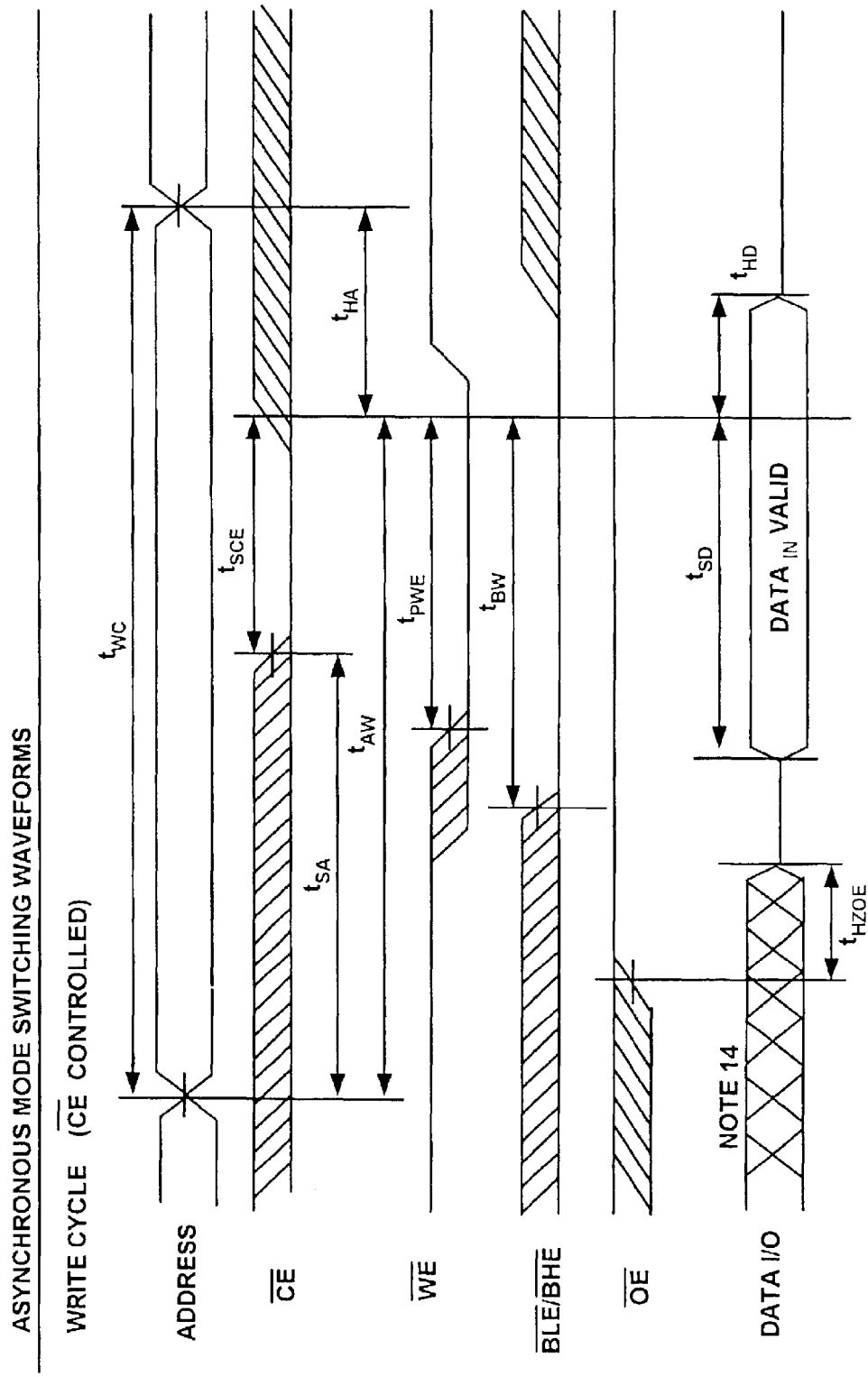
Figure 8C:
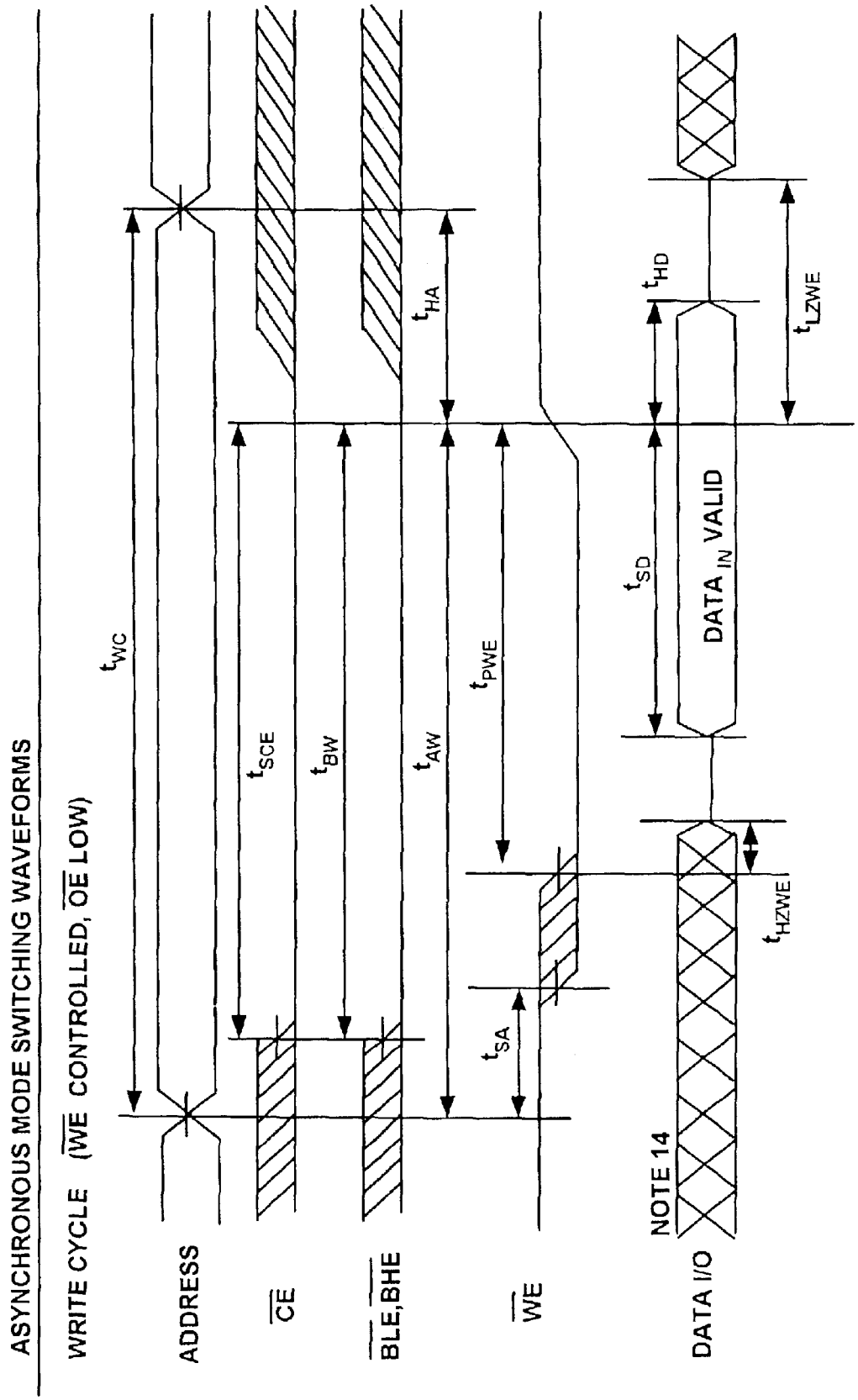
Figure 8D:
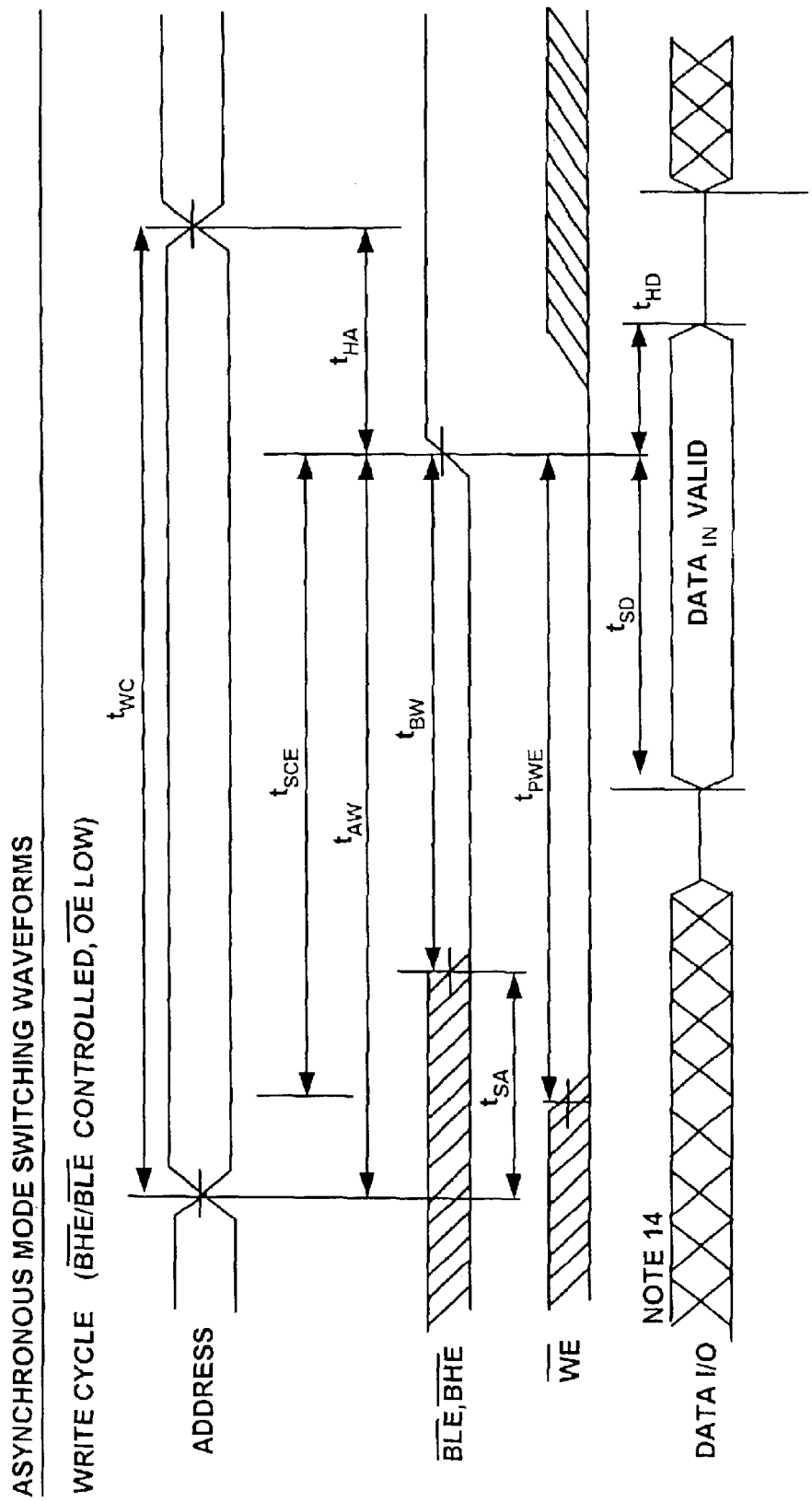

FIG. 8A shows a timing diagram of an asynchronous write operation, in accordance with one embodiment of the present invention. During normal asynchronous writing mode, the chip enable (/CE) and write enable (/WE) are asserted low. If the byte low enable (BLE) is low, then data from the low I/O pins (I/O0–I/O7) is written to the location specified on the address pins. If byte high enable (/BHE) is low, then data from the high I/O pins (I/O8–18/15) is written to the location specified on the address pins. In FIG. 8A, the write cycle occurs on the byte low enable (/BLE) or byte high enable (/BHE) transition. Another possible implementation is shown in FIG. 8B, where the write cycle occurs on the chip enable (/CE) transition. Another possible implementation is shown in FIG. 8C, where the write cycle occurs on the write enable (/WE) transition. In yet another possible implementation shown in FIG. 8D, the write cycle occurs on the byte low enable (/BLE) or byte high enable (/BHE) transition.

Figure 9A:
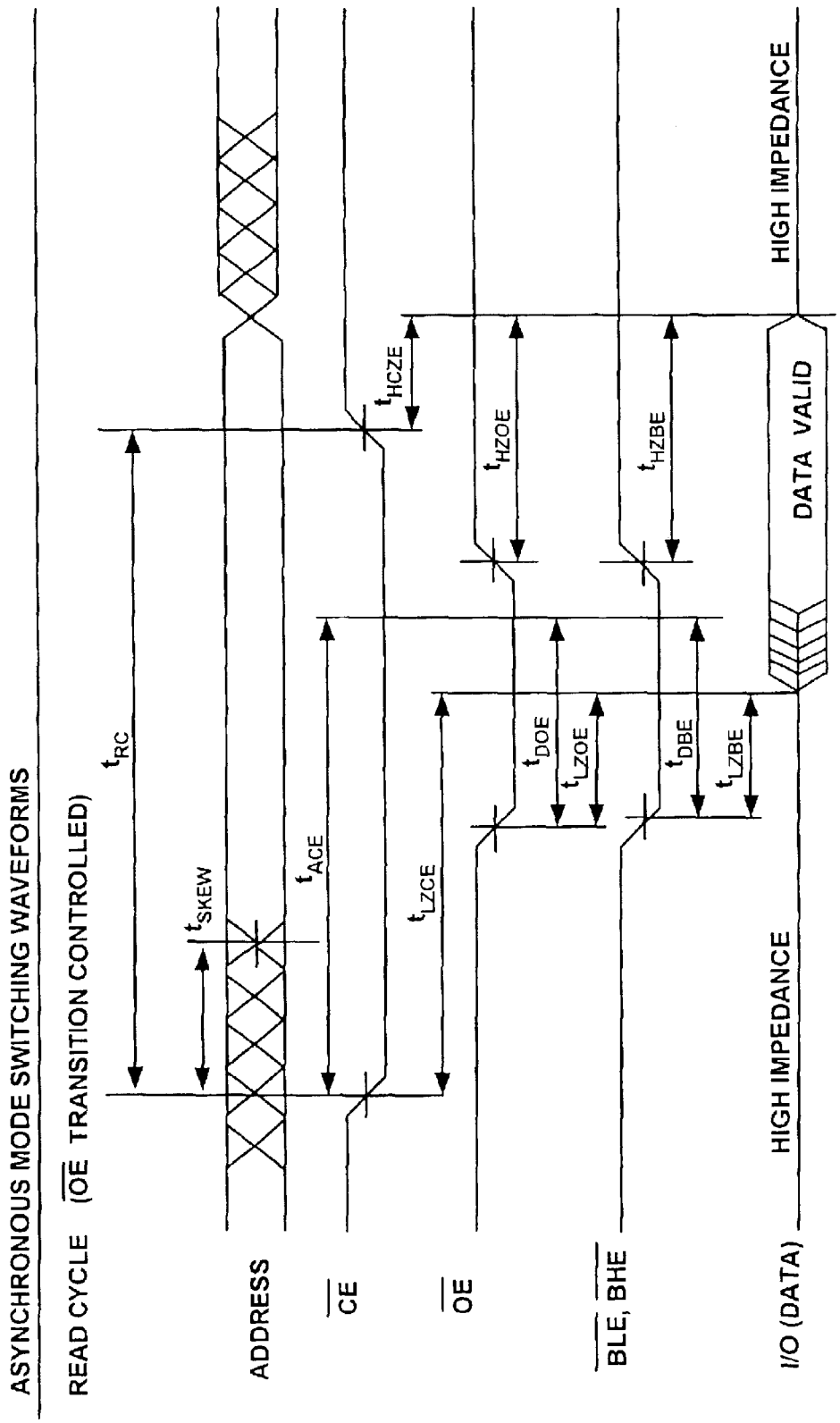
FIGS. 9A and 9B show timing diagrams of asynchronous read operations, in accordance with various possible implementations of the present invention.
Figure 9B:
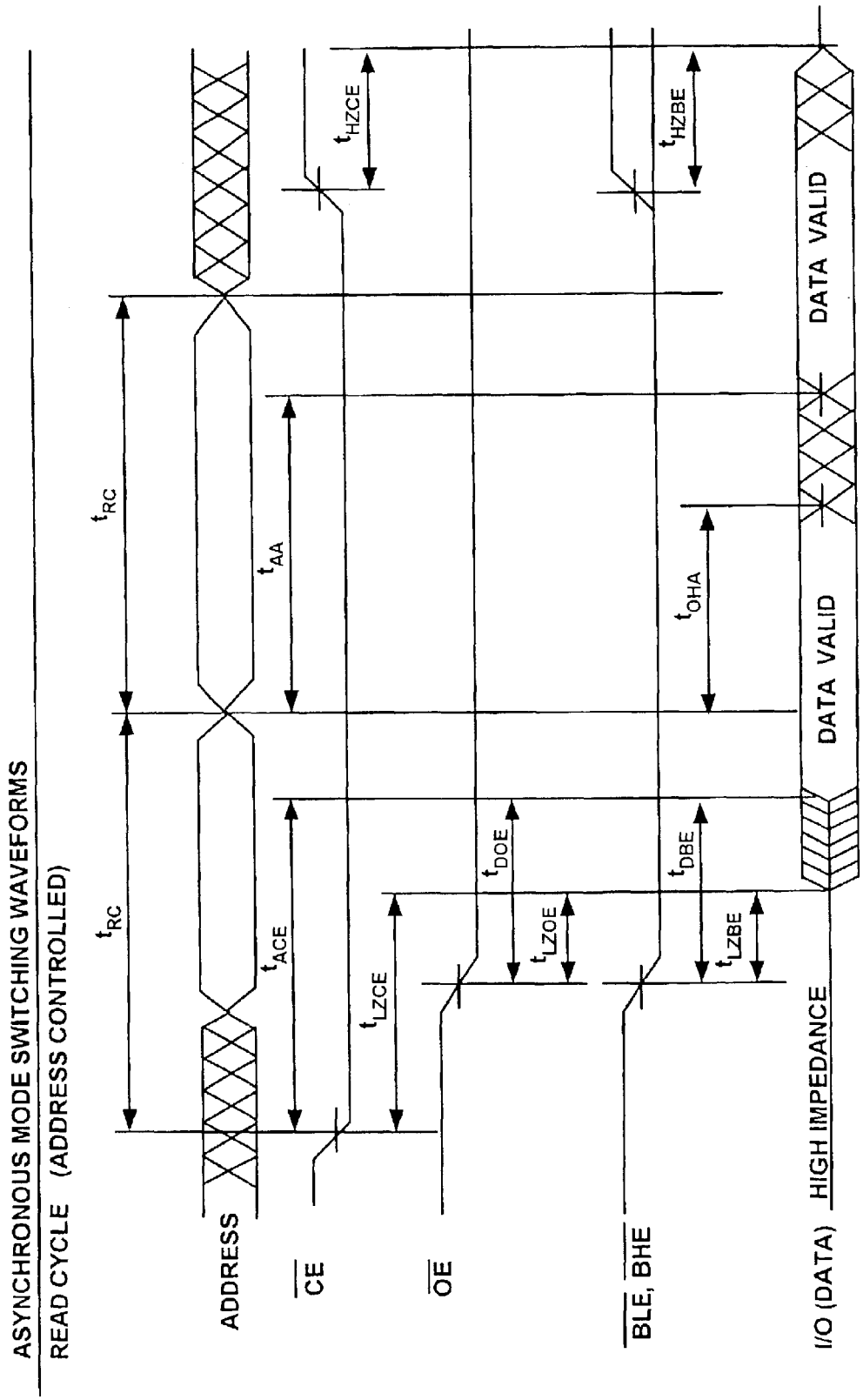

FIG. 9A shows a timing diagram of an asynchronous read operation, in accordance with one embodiment of the present invention. During normal asynchronous read mode, along with the chip enable (/CE) and output enable (/OE) are asserted low, write enable (/WE) is asserted high. If the byte low enable (/BLE) is low, then data from the memory location specified by the address pins will appear on the lower I/O pins. If byte high enable (/BHE) is low, then data will appear on upper I/O pins. In FIG. 9A, the read cycle occurs on the output enable (/OE) transition. Another possible implementation is shown in FIG. 9B, where the write cycle is address controlled.

Figure 10A:
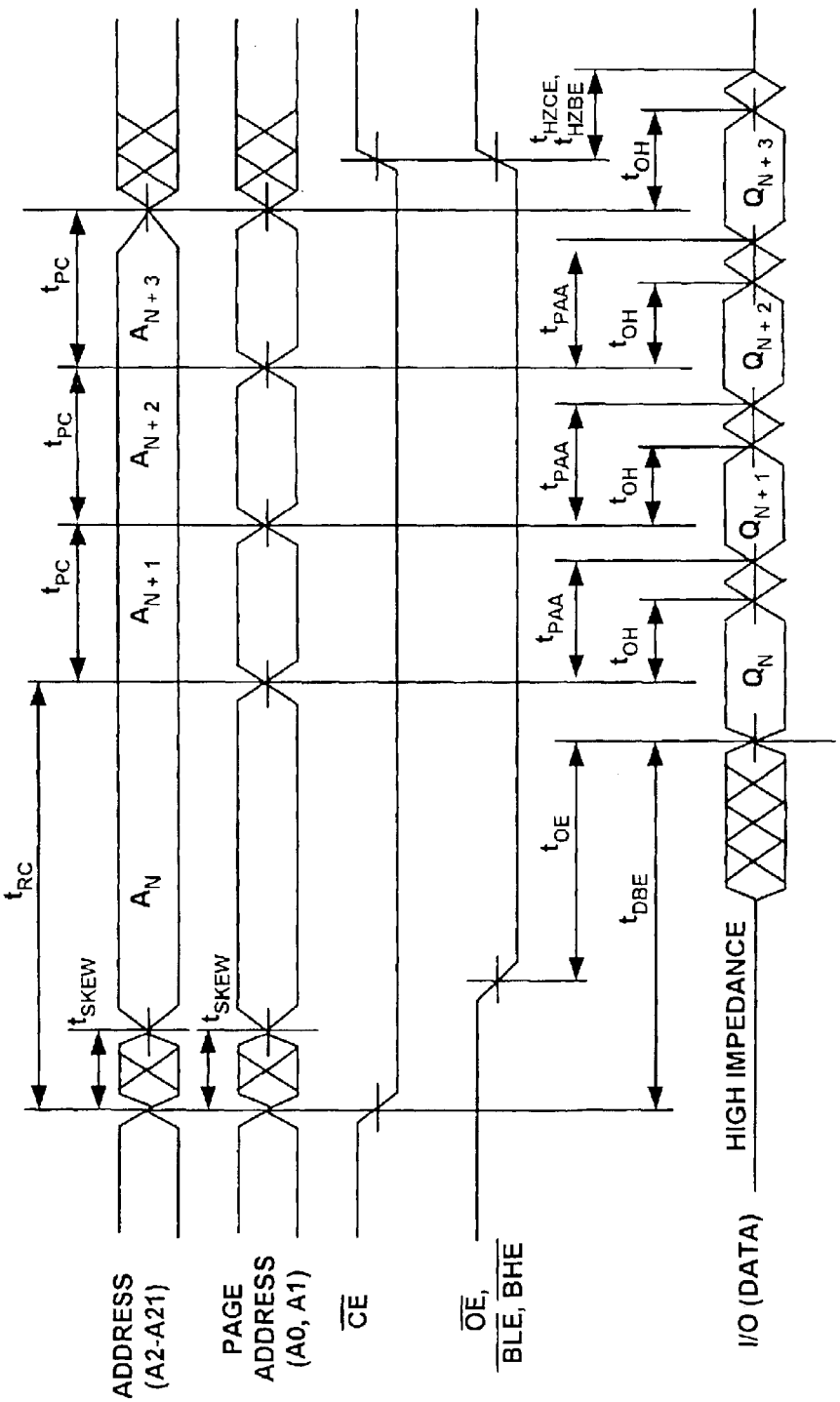
FIGS. 10A and 10B show timing diagrams of optional asynchronous page mode read operations, in accordance with various possible implementations of the present invention.
Figure 10B:
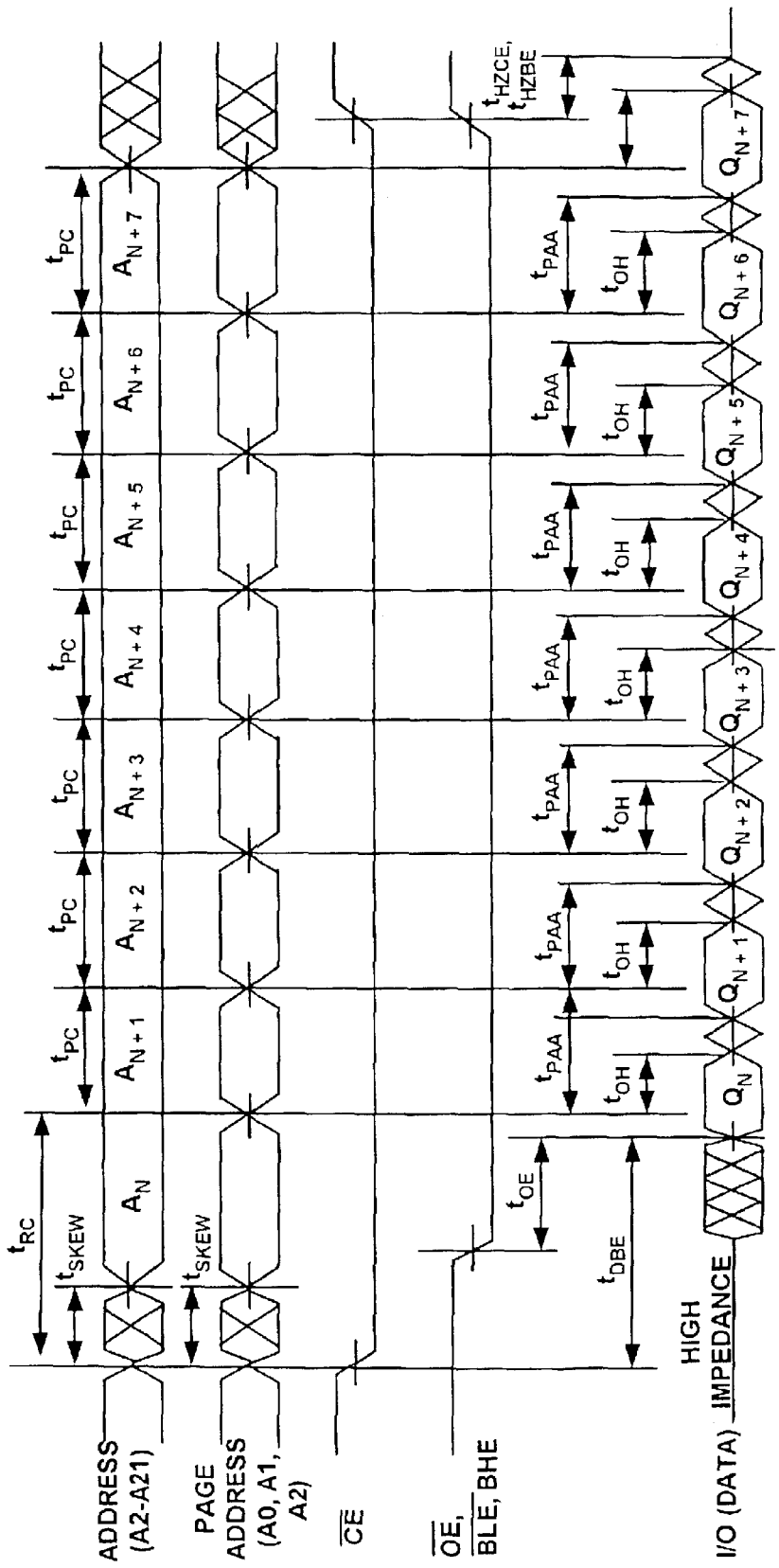

FIGS. 10A and 10B show timing diagrams of optional asynchronous page mode read operations, in accordance with various embodiments of the present invention. An asynchronous page mode read is accomplished by initiating a normal mode read of the memory device, while leaving the output enable (/OE) low. The page length is determined by the most significant address bits. In an exemplary configuration, all the address bits except for A1 and A0 should be fixed until the page access is completed for four-word page access operation, as shown in FIG. 10A. In FIG. 10A, each read cycle occurs on the address transitions. For an eight-word page access, all the bits should be fixed except for A2, A1, and A0, as shown in FIG. 10B.

Figure 11A:
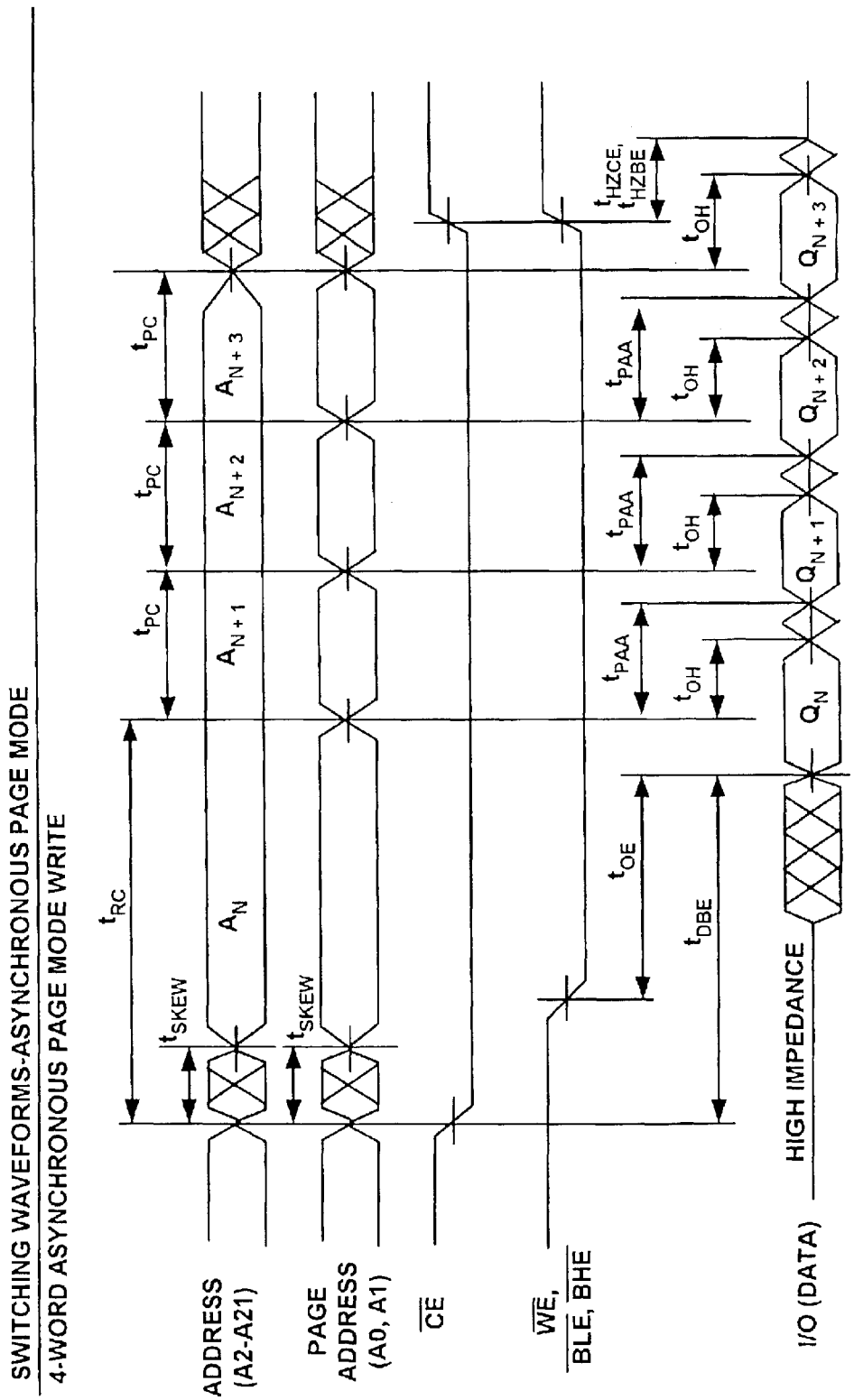
FIGS. 11A and 11B show timing diagrams of optional asynchronous page mode write operations, in accordance with various possible implementations of the present invention.
Figure 11B:
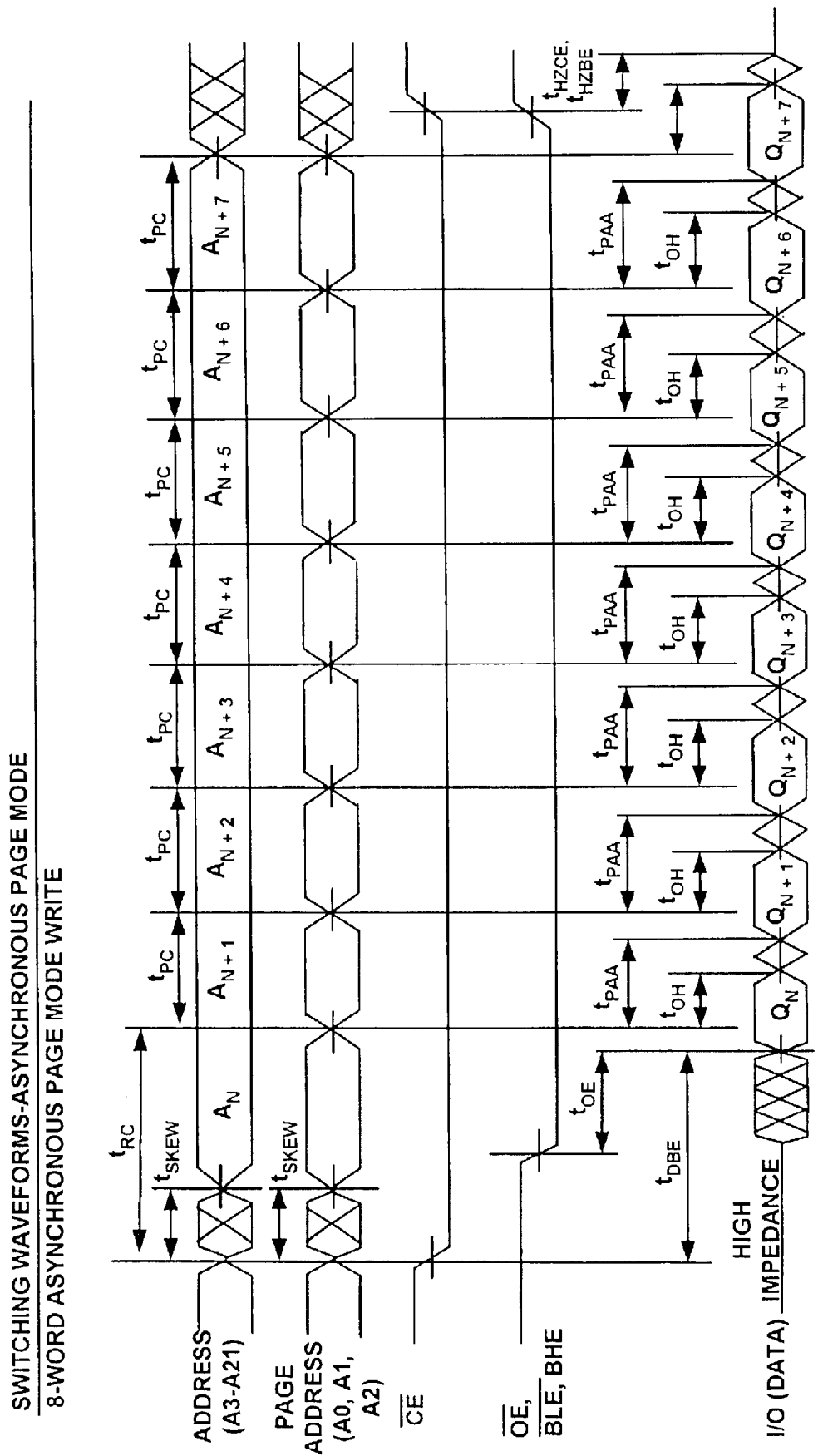

FIGS. 11A and 11B show timing diagrams of optional asynchronous page mode write operations, in accordance with various embodiments of the present invention. An asynchronous page mode write is accomplished by initiating a normal mode write of the memory device, while leaving the write enable (/WE) low. The output enable (/OE) is ignored during a write cycle. The page length is determined by the most significant address bits. In an exemplary configuration, all the address bits except for A1 and A0 should be fixed until the page access is completed for four-word page access operation, as shown in FIG. 11A. In FIG. 11A, each write cycle occurs on the address transitions. For an eight-word page access all the bits should be fixed except for A2, A1, and A0, as shown in FIG. 11B.

Figure 12:
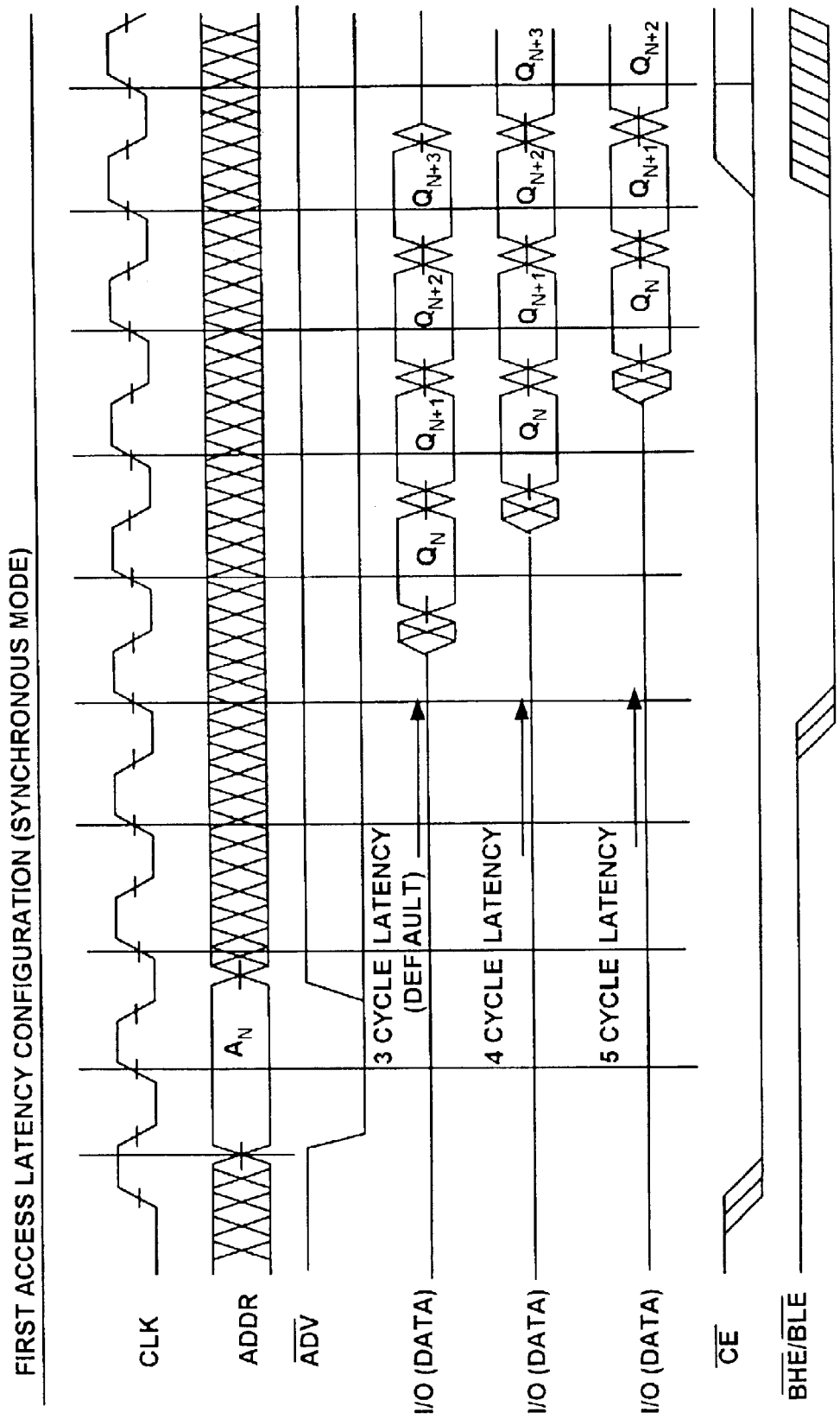
FIG. 12 shows a timing diagram of a synchronous read operation, in accordance with one possible implementation of the present invention.

FIG. 12 shows a timing diagram of a synchronous read operation, in accordance with one embodiment of the present invention. During a synchronous read, the chip enable (/CE) is asserted low at the rising edge of a clock signal. If advance (/ADV) is asserted low, the address presented to the device will be latched. Byte low enable (/BLE) and byte high enable (/BHE) can be used to control which data byte is being read.

Figure 13A:
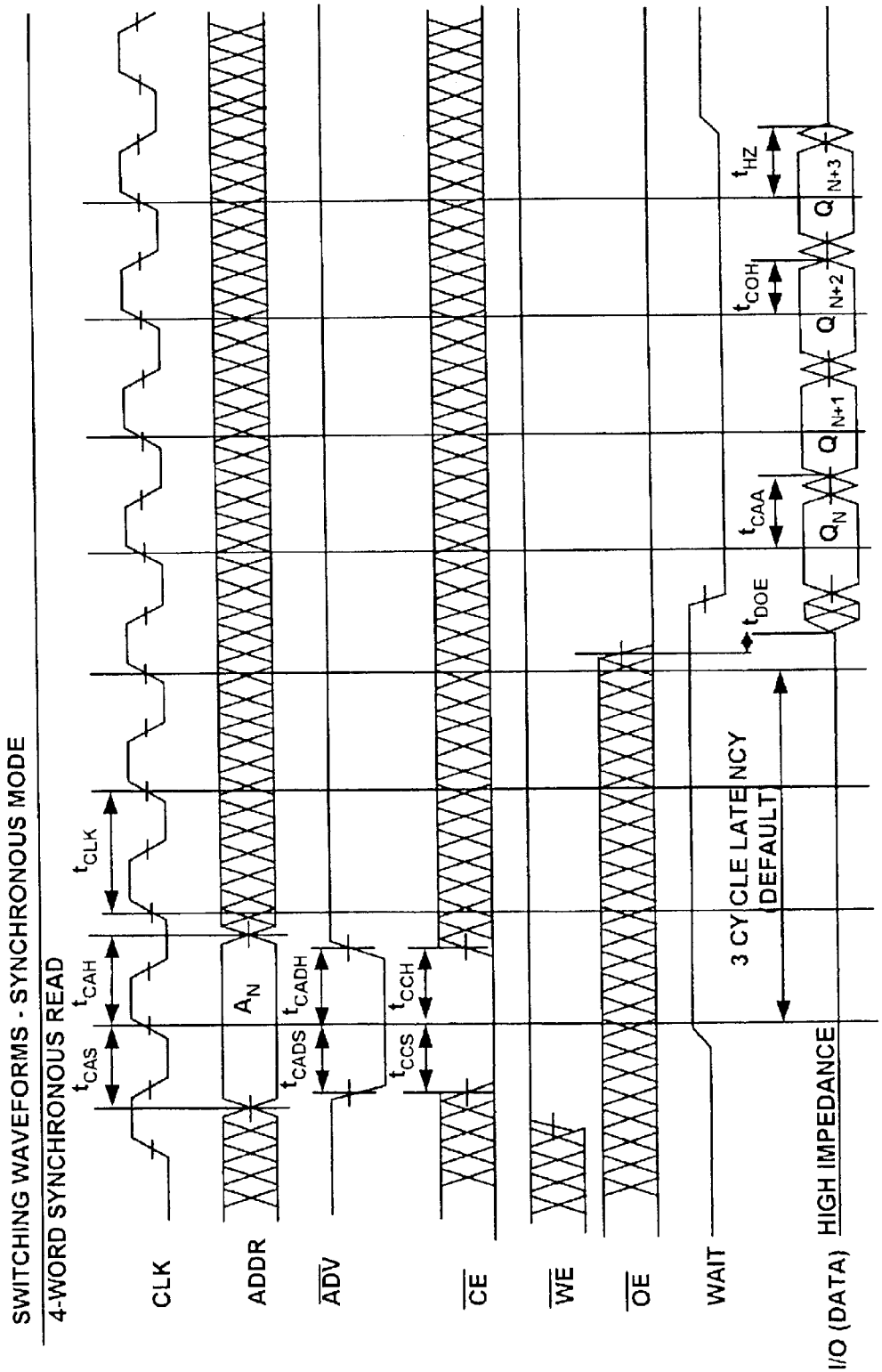
FIG. 13A shows a timing diagram of an optional burst synchronous read operation, in accordance with one possible implementation of the present invention.

FIG. 13A shows a timing diagram of an optional burst synchronous read operation, in accordance with one embodiment of the present invention. A burst counter is provided for synchronous read operations that allows the user to supply a single address to execute multiple reads without reasserting the address inputs. The configuration register can be used to specify the number of multiple reads to be performed. The burst length can be 4-word, 8-word, 16-word, 512-word, or the like. To execute a burst read, advance (/ADV) is driven low in order to load a new address into the memory device. A high input on advance (/ADV) will increment the internal burst counter regardless of the state of the chip enable (/CE) inputs or write enable (/WE). The output enable (/OE) should remain low during the entire burst access. The wait pin is driven low when valid data is on the bus. The sequence of the burst counter, either linear or interleaved, can also be set in the configuration register. FIG. 13B, shows exemplary burst address sequences, in accordance with one possible implementation of the present invention.

Figure 14:
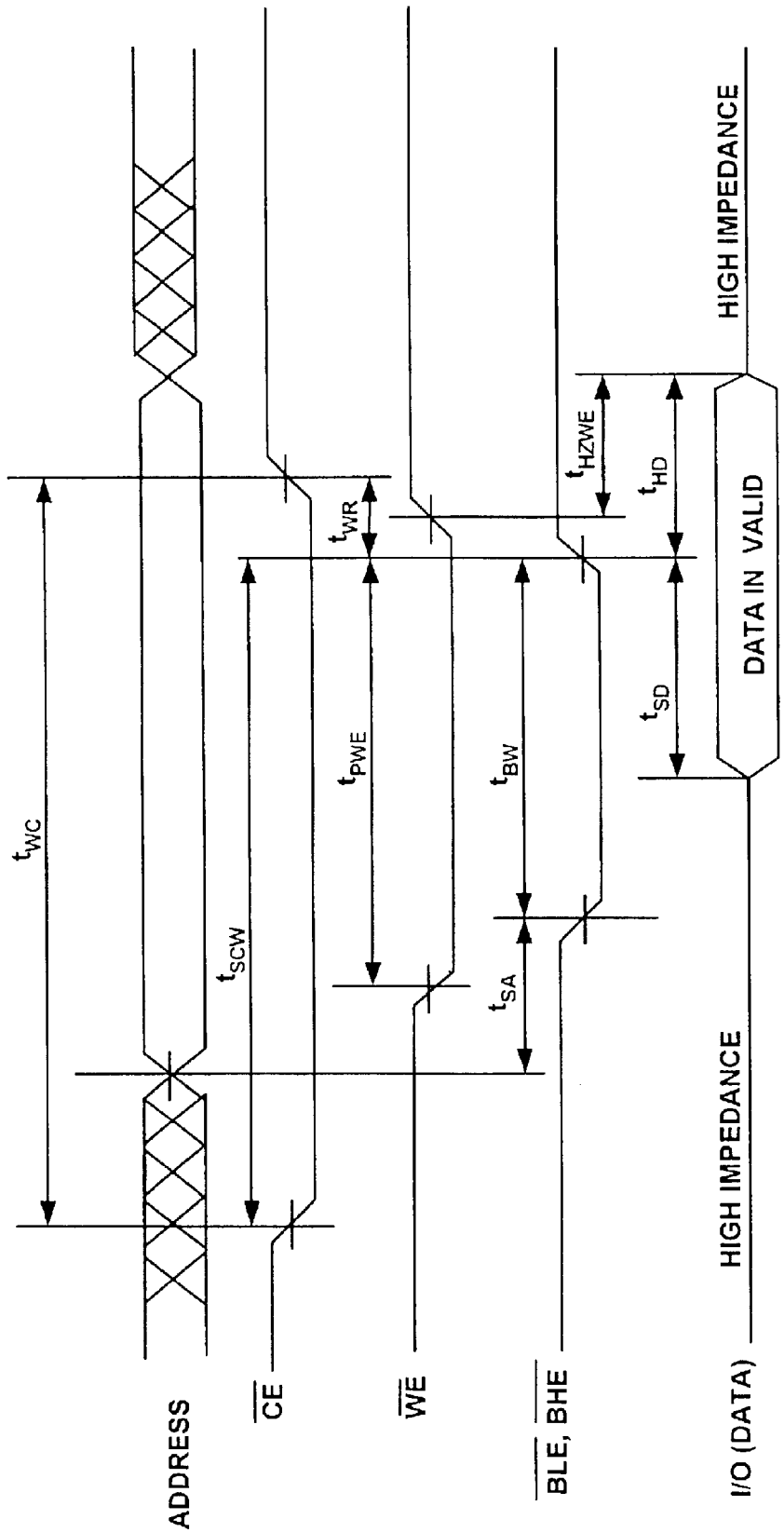
FIG. 14 shows a timing diagram of an asynchronous write operation, in accordance with one possible implementation of the present invention.

FIG. 14 shows a timing diagram of an asynchronous write operation, in accordance with one embodiment of the present invention. During writing mode, writing is accomplished asynchronously by taking chip enable (/CE) low and write enable (/WE) input low. If the byte low enable (/BLE) is low, then data from the low I/O pins (I/O0–I/O7) is written to the location specified on the address pins. If byte high enable (/BHE) is low, then data from the high I/O pins (I/O8–18/15) is written to the location specified on the address pins. The clock is ignored in this mode.

Figure 15:
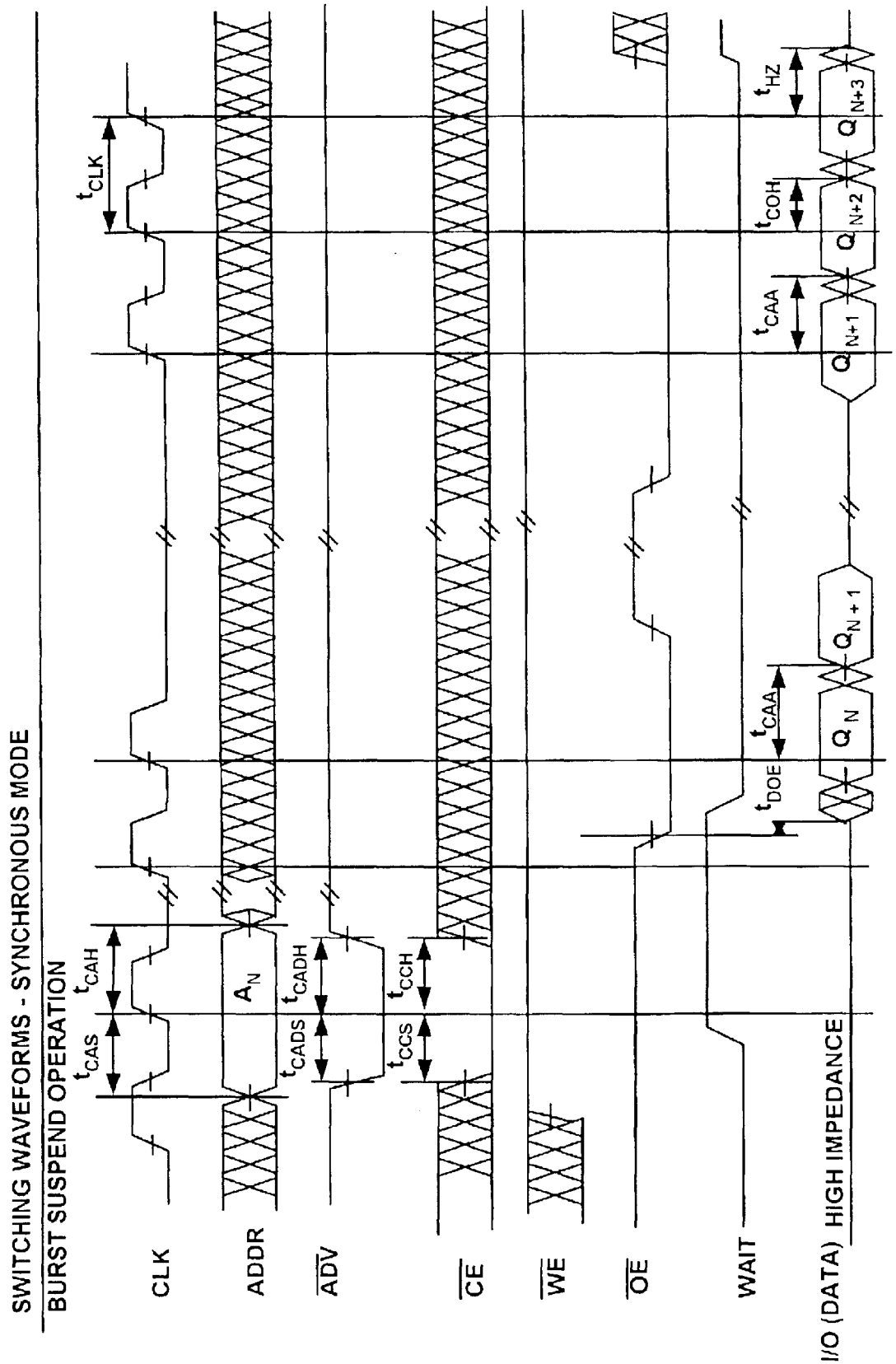
FIG. 15 shows a timing diagram of a synchronous read operation, in accordance with one possible implementation of the present invention.

In an optional feature, the burst mode can be suspended. FIG. 15 shows a timing diagram of a synchronous read operation, in accordance with one embodiment of the present invention. If the clock (CLK) is held low during a burst read cycle, the mode is suspended. The burst starts from the point at which it left off when the clock (CLK) starts toggling.

Figure 16:
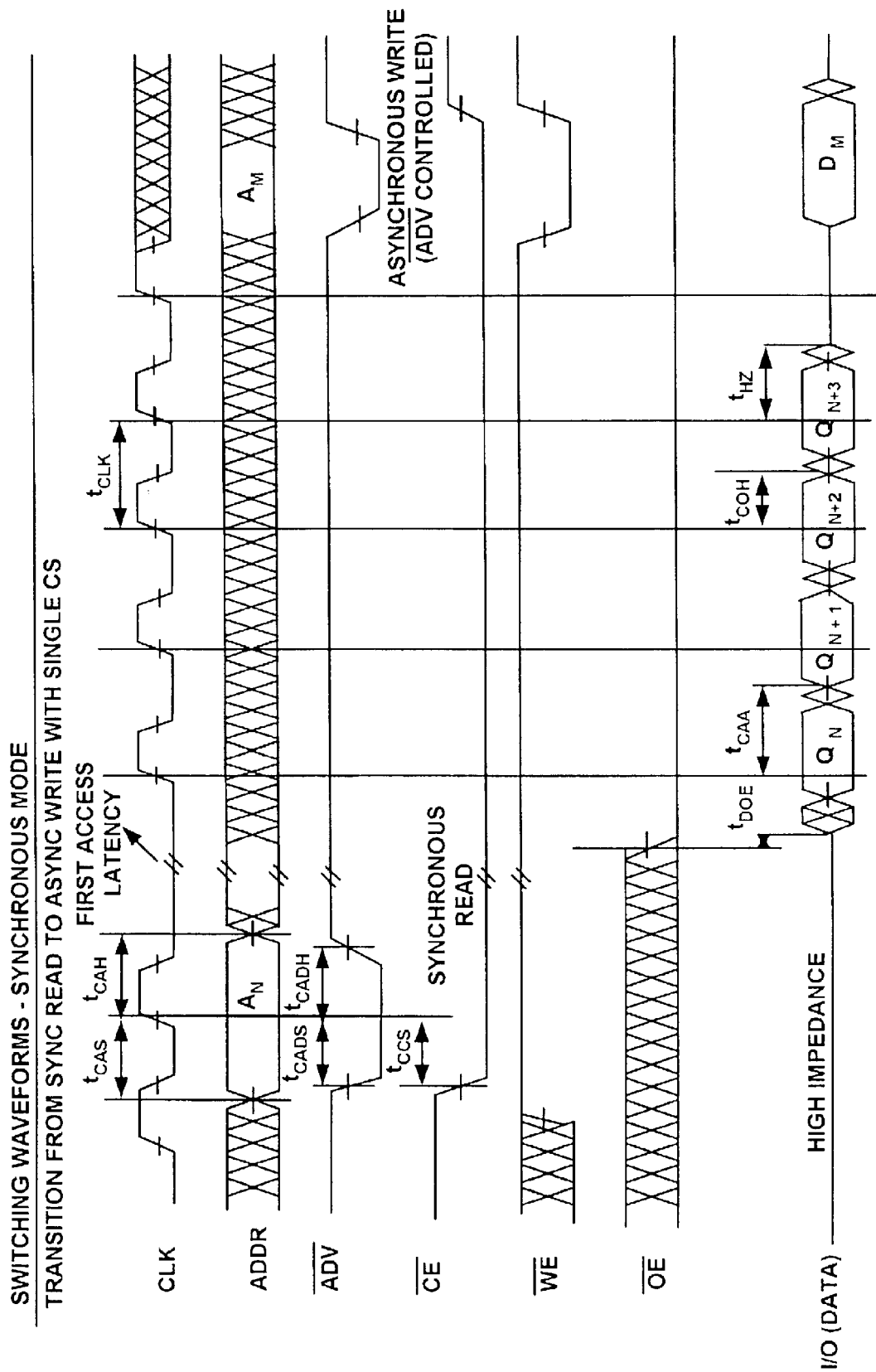
FIG. 16 shows a timing diagram of a switching waveform, in accordance with one implementation of the present invention.

In another optional feature, the memory device can transition from a synchronous read mode to an asynchronous write mode. FIG. 16 shows a timing diagram of a switching waveform, in accordance with one implementation. First, the advance (/ADV) control signal is driven low in order to load a new address into the memory device. A high input on advance (/ADV) will increment the internal burst counter regardless of the state of the chip enable (/CE) inputs or write enable (/WE). The output enable (/OE) should remain low during the entire burst access. The wait pin is driven low when valid data is on the bus, to execute a burst read. Next, to execute an asynchronous write, the write enable is asserted low along with asserting the advance low. The chip enable and output enable are continued to be held low.

Figure 17:
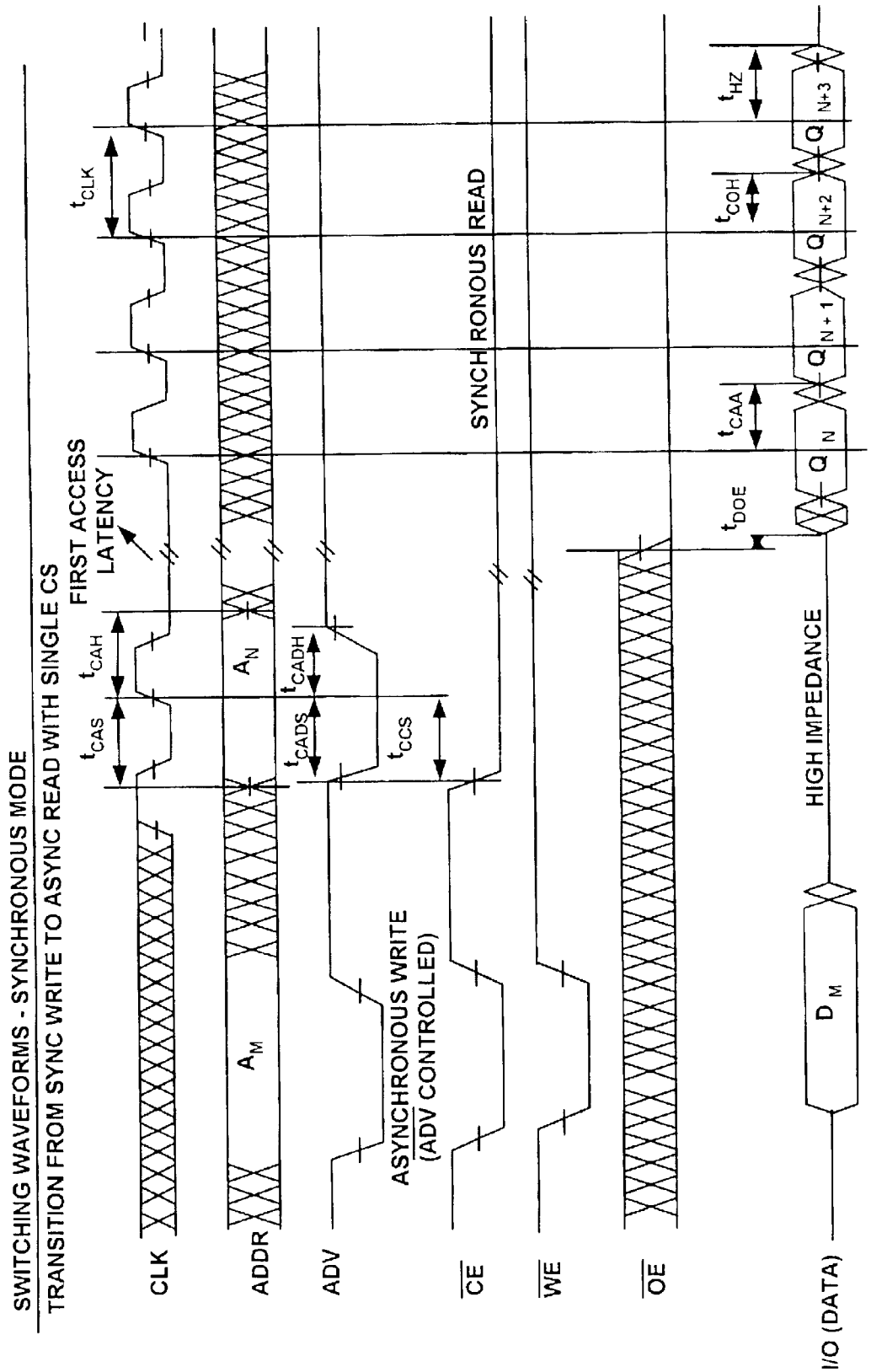
FIG. 17 shows a timing diagram of a switching waveform, in accordance with one possible implementation of the present invention.

In yet another optional feature, the memory device can transition from an asynchronous write to synchronous read. FIG. 17 shows a timing diagram of a switching waveform, in accordance with one possible implementation. First, the chip enable (/CE) control signal and write enable (/WE) are asserted low, to execute an asynchronous write. Next, to execute a synchronous read, the advance (/ADV) control signal is driven low in order to load a new address into the memory device. A high input on advance (/ADV) will increment the internal burst counter regardless of the state of the chip enable (/CE) inputs or write enable (/WE). The output enable (/OE) should remain low during the entire burst access. The wait pin is driven low when valid data is on the bus.

Embodiments of the present invention advantageously provide a memory device capable of transferring data asynchronously and synchronously. The multiple modes of data transfer, provided by embodiments of the present invention, advantageously allows for replacing NOR-flash (e.g., relatively fast and expensive) with NAND-flash (e.g., relatively slow but inexpensive). Furthermore, embodiments of the present invention are advantageous in that the memory device may be operated as a read through device (e.g., tunnel flash memory).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory device data transfer method comprising:
   determining a transfer mode between synchronous and asynchronous, wherein a configuration register specifies said transfer mode between synchronous and asynchronous;
   determining whether said transfer mode is write or read; and
   transferring data according to said determined mode.

2. The method according to claim 1, wherein said configuration register specifies a plurality of functionalities of said transfer mode.

3. The method according to claim 1, wherein a first state of a plurality of control signals specifies that said transfer mode is synchronous.

4. The method according to claim 1, wherein a second state of a plurality of control signals specifies that said transfer mode is asynchronous.

5. The method according to claim 1, wherein a third state of a plurality of control signals specifies that said transfer mode is write.

6. The method according to claim 1, wherein a fourth state of a plurality of control signals specifies that said transfer mode is read.

7. A memory device comprising:
   an array of memory cells for storing data;
   an asynchronous/synchronous logic coupled to a plurality of control signals and said array of memory cells, wherein asynchronous transfer of data stored in said array of memory cells is provided based upon a first state of said control signals and wherein synchronous transfer of data stored in said array of memory cells is provided based upon a second state of said control signals; and
   a configuration register coupled to said asynchronous/synchronous logic, wherein said first state of said control signals or said second state of said control signals is latched for access by said asynchronous/synchronous logic.

8. The memory device according to claim 7, further comprising:
   an address buffer coupled to an address bus;
   an address register coupled to said address buffer and said control logic, wherein an address is latched during synchronous transfers;
   an address decoder coupled to said array of memory cells, and said address buffer during asynchronous transfers, and said address register during synchronous transfers, wherein a memory cell is selected;
   a sense amplifier coupled to said array of memory cells, wherein a state of said selected memory cell is detected;
   a data-in driver coupled to said array of memory cells and a data bus, wherein a state of said selected memory cell is programmed;
   a data register coupled to said data-in driver and said sense amplifier, wherein a data is latched during synchronous transfers;

a data buffer coupled to a data bus, and said data-in driver and said sense amplifier during asynchronous transfers, and said data register during synchronous transfers; and a control logic coupled to a plurality of control signals, wherein operation of said address register, said address decoder, said sense amplifier, said data-in drive and said data registers are controlled in response to said control signals.

9. A plurality of transfer methods comprising:

transferring data asynchronously;

transferring data synchronously;

switching from transferring data synchronously to transferring data asynchronously;

switching from transferring data asynchronously to transferring data synchronously; and wherein a configuration register provides for selection between said transferring data asynchronous and said transferring data synchronous.

10. The plurality of transfer methods according to claim 9, wherein said transferring data asynchronously comprises:

reading data; and writing data.

11. The plurality of transfer methods according to claim 10, wherein said reading data asynchronously comprises reading a plurality of words.

12. The plurality of transfer methods according to claim 10, wherein said writing data asynchronously comprises writing a plurality of words.

13. The plurality of transfer methods according to claim 9, wherein said transferring data synchronously comprises reading data.

14. The plurality of transfer methods according to claim 13, wherein said reading data synchronously comprises reading a burst of words.

15. The plurality of transfer methods according to claim 13, wherein said reading data synchronously further comprises providing a specified data latency.

16. The plurality of transfer methods according to claim 9, wherein switching from transferring data synchronously to transferring data asynchronously further comprises switching from reading data synchronously to writing data asynchronously.

17. The plurality of transfer methods according to claim 9, wherein switching from transferring data asynchronously to transferring data synchronously further comprises switching from writing data asynchronously to reading data synchronously.

18. The plurality of transfer methods according to claim 9, wherein said configuration register further provides for selection of a plurality of functionalities of said plurality of transfer methods.

* * * * *